(12) United States Patent
Kondo et al.

(10) Patent No.: US 9,831,423 B2
(45) Date of Patent: Nov. 28, 2017

(54) MAGNETIC MEMORY AND METHOD FOR MANUFACTURING SAME

(71) Applicant: Kabushiki Kaisha Toshiba, Tokyo (JP)

(72) Inventors: Tsuyoshi Kondo, Kanagawa (JP); Takuya Shimada, Kanagawa (JP); Yasuaki Ootera, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/260,517

(22) Filed: Sep. 9, 2016

(65) Prior Publication Data

US 2017/0077174 A1   Mar. 16, 2017

(30) Foreign Application Priority Data

Sep. 14, 2015 (JP) ................................. 2015-181172

(51) Int. Cl.
*H01L 27/22* (2006.01)
*H01L 43/12* (2006.01)
(Continued)

(52) U.S. Cl.
CPC ............ *H01L 43/12* (2013.01); *G11C 11/161* (2013.01); *G11C 11/1659* (2013.01);
(Continued)

(58) Field of Classification Search
CPC ....... H01L 27/222; H01L 43/02; H01L 43/12; H01L 27/228; H01L 27/224; H01L 43/08;
(Continued)

(56) References Cited

U.S. PATENT DOCUMENTS 7,688,623 B2 * 3/2010 Maekawa ............... G11C 11/16
365/158
2010/0328986 A1 * 12/2010 Tsai ........................ G11C 5/02
365/80

(Continued)

FOREIGN PATENT DOCUMENTS

| JP | 2004-288844 | 10/2004 |
|---|---|---|
| JP | 2008-171945 | 7/2008 |
| JP | 2014-143302 | 8/2014 |
| JP | 2016-143432 | 8/2016 |

*Primary Examiner* — Bo Fan
(74) *Attorney, Agent, or Firm* — Finnegan, Henderson, Farabow, Garrett & Dunner, L.L.P.

(57) ABSTRACT

According to one embodiment, a magnetic memory includes a structure body including a first magnetic layer and a conductive layer, a second magnetic layer, a first electrode, a second electrode, a third magnetic layer, an intermediate layer, a third electrode, a fourth magnetic layer, and a circuit element. The first magnetic layer is disposed between the second magnetic layer and the conductive layer. The first electrode is connected to a first portion of the structure body. The intermediate layer is provided between the third magnetic layer and the second magnetic layer. The circuit element includes a first semiconductor layer, a second semiconductor layer, and a third semiconductor layer. The first semiconductor layer is connected to the first electrode. The second semiconductor layer is connected to the third magnetic layer. The third semiconductor layer is connected to the first semiconductor layer and the second semiconductor layer.

15 Claims, 15 Drawing Sheets

(51) Int. Cl.
*G11C 11/16* (2006.01)
*G11C 19/08* (2006.01)
*H01L 43/08* (2006.01)

(52) U.S. Cl.
CPC ...... *G11C 11/1673* (2013.01); *G11C 11/1675* (2013.01); *G11C 19/0841* (2013.01); *H01L 27/224* (2013.01); *H01L 27/228* (2013.01); *H01L 43/08* (2013.01)

(58) Field of Classification Search
CPC ............ G11C 11/1675; G11C 11/1673; G11C 11/161; G11C 11/1659; G11C 19/0841
USPC ........................................................ 257/421
See application file for complete search history.

(56) References Cited

U.S. PATENT DOCUMENTS

| | | | |
|---|---|---|---|
| 2012/0074511 A1* | 3/2012 | Takahashi | H01L 27/228 257/427 |
| 2012/0241881 A1* | 9/2012 | Daibou | H01L 43/10 257/421 |
| 2014/0169088 A1* | 6/2014 | Buhrman | G11C 11/18 365/158 |
| 2014/0241047 A1* | 8/2014 | Guo | H01L 27/228 365/158 |
| 2014/0293685 A1* | 10/2014 | Noguchi | G11C 11/1675 365/158 |
| 2015/0036415 A1 | 2/2015 | Di Pendina et al. | |
| 2016/0224242 A1 | 8/2016 | Kondo et al. | |

* cited by examiner

MAGNETIC MEMORY AND METHOD FOR MANUFACTURING SAME

CROSS-REFERENCE TO RELATED APPLICATIONS

This application is based upon and claims the benefit of priority from Japanese Patent Application No. 2015-181172, filed on Sep. 14, 2015; the entire contents of which are incorporated herein by reference.

FIELD

Embodiments described herein relate generally to a magnetic memory and a method for manufacturing same.

BACKGROUND

Three-terminal type magnetic random access memory using a torque originating spin-orbit interaction has been proposed. In the magnetic memory, improvement of the integration density is desired.

DESCRIPTION OF EMBODIMENTS

Figure 1:
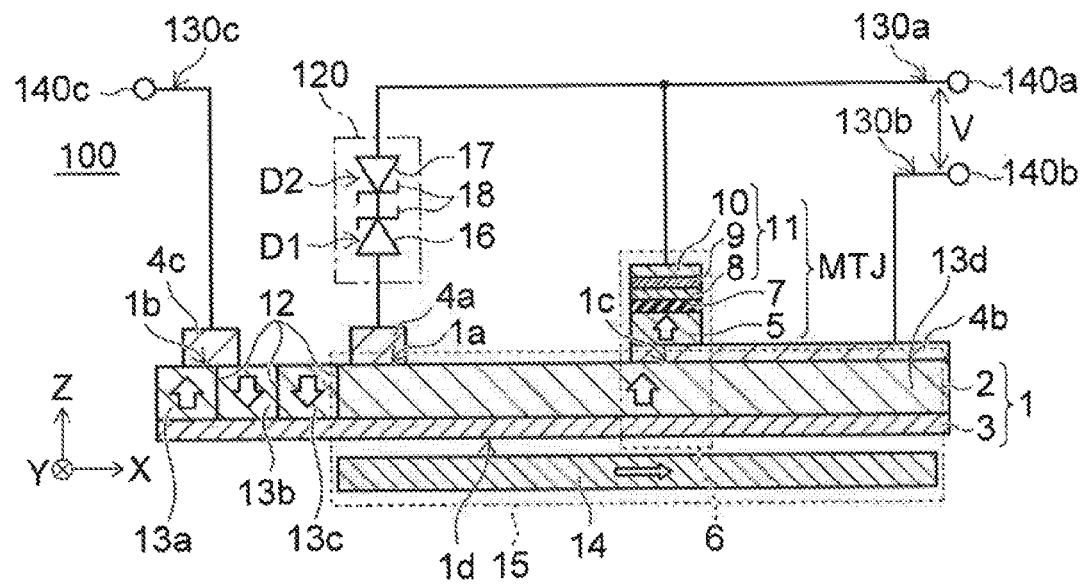
FIG. 1 and FIG. 2 are schematic cross-sectional views showing a magnetic memory according to a first embodiment.

According to one embodiment, a magnetic memory includes a structure body including a first magnetic layer and a conductive layer, a second magnetic layer, a first electrode, a second electrode, a third magnetic layer, an intermediate layer, a third electrode, a fourth magnetic layer, and a circuit element. The first magnetic layer is disposed between the second magnetic layer and the conductive layer. The first electrode is electrically connected to a first portion of the structure body. The second electrode is provided between the first magnetic layer and the second magnetic layer. The intermediate layer is provided between the third magnetic layer and the second magnetic layer. The third electrode is electrically connected to a second portion of the structure body. The fourth magnetic layer is provided to be insulated from a third portion of the structure body. The circuit element includes a first semiconductor layer of a first conductivity type, a second semiconductor layer of the first conductivity type, and a third semiconductor layer of a second conductivity type. The first semiconductor layer is electrically connected to the first electrode. The second semiconductor layer is electrically connected to the third magnetic layer. The third semiconductor layer is electrically connected to the first semiconductor layer and the second semiconductor layer.

According to another embodiment, a method for manufacturing a magnetic memory includes forming a semiconductor structure in a semiconductor substrate, forming a first magnetic structure on the semiconductor structure, forming a first electrode structure on the first magnetic structure, forming a second magnetic structure on the first electrode structure, forming a second electrode structure on the second magnetic structure, forming an insulating film on the second electrode structure, forming a hole in the insulating film, forming a structure body inside the hole, and forming a third electrode structure electrically connected to the structure body. The semiconductor structure includes a first transistor, a second transistor, a first semiconductor layer of a first conductivity type, a second semiconductor layer of a second conductivity type, and a third semiconductor layer of the first conductivity type. The first transistor includes a first current path. The second transistor includes a second current path. The second semiconductor layer is electrically connected to the first semiconductor layer. The third semiconductor layer is electrically connected to the second semiconductor layer. The first magnetic structure includes a first magnetic layer, a second magnetic layer, and an intermediate layer. The intermediate layer is provided between the first magnetic layer and the second magnetic layer. The first magnetic layer is electrically connected to the first semiconductor layer and one end of the first current path. The first electrode structure is electrically connected to the second magnetic layer and one end of the second current path. The second magnetic structure includes a third magnetic layer. The second electrode structure is electrically connected to the third semiconductor layer. The hole exposes the first electrode structure at a bottom portion of the hole. The hole exposes the second electrode structure at a side portion of the hole. The structure body includes a fourth magnetic layer and a conductive layer.

According to yet another embodiment, a magnetic memory includes a first transistor, a second transistor, a first semiconductor layer being of a first conductivity type, semiconductor layer being of a first conductivity type a second semiconductor layer being of a second conductivity type, a third semiconductor layer being of the first conductivity type, a first magnetic structure, a first electrode structure, a second magnetic structure, a second electrode structure, an insulating film, a hole, a structure body, and a third electrode structure. The first transistor includes a first current path. The second transistor includes a second current path. The first semiconductor layer is electrically connected to one end of the first current path. The second semiconductor layer is electrically connected to the first semiconductor layer. The third semiconductor layer is electrically connected to the second semiconductor layer. The first magnetic structure is electrically connected to the first semiconductor layer and one end of the first current path. The first magnetic structure includes a first magnetic layer, a second magnetic layer, and an intermediate layer. The intermediate layer is provided between the first magnetic layer and the second magnetic layer. The first electrode structure is provided on the first magnetic structure. The first electrode structure is electrically connected to the second magnetic layer and one end of the second current path. The second magnetic structure is provided on the first electrode structure. The second magnetic structure includes a third magnetic layer. The second electrode structure is provided on the second magnetic structure. The second electrode structure is electrically connected to the third semiconductor layer. The insulating film provided on the second electrode structure. The hole provided in the insulating film. The first electrode structure is exposed at a bottom portion of the hole. The second electrode structure is exposed at a side portion of the hole. The structure body is provided in the hole. The third electrode structure is electrically connected to the structure body.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 2:
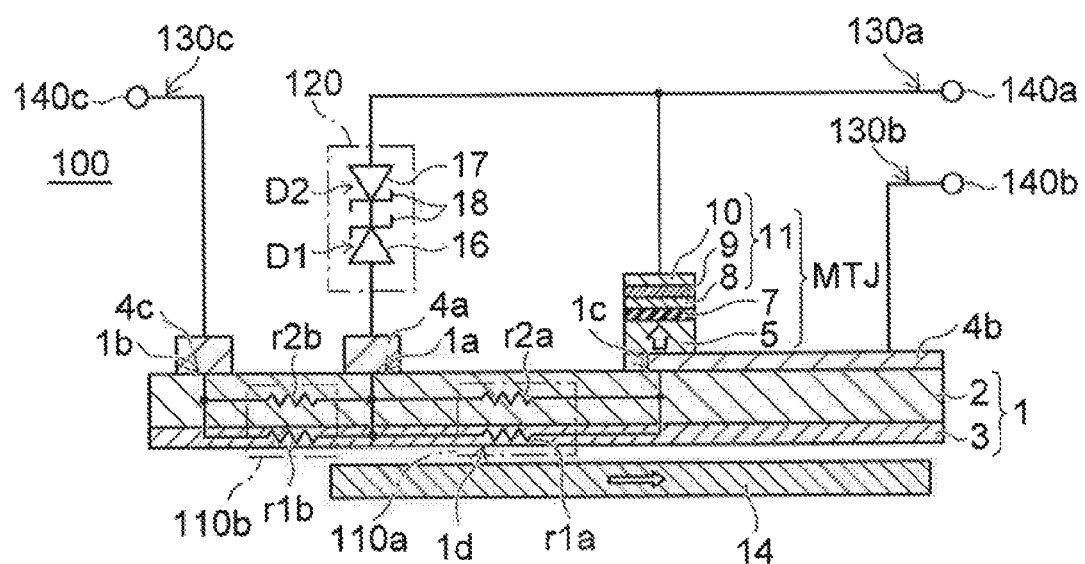

FIG. 1 and FIG. 2 are schematic cross-sectional views showing a magnetic memory according to a first embodiment.

As shown in FIG. 1, the magnetic memory 100 according to the first embodiment includes a structure body 1. The structure body 1 includes a first magnetic layer 2 and a conductive layer 3. A first electrode 4a is provided on a first portion 1a of the structure body 1. Although the first portion 1a is on the first magnetic layer 2 in the example of FIG. 1, in the embodiment, the first portion 1a may be on the conductive layer 3 or may be on the first magnetic layer 2 and the conductive layer 3. A second electrode 4b is provided on the first magnetic layer 2 of the structure body 1. The second electrode 4b is separated from the first electrode 4a. A third electrode 4c is provided on a second portion 1b of the structure body 1. The second portion 1b is separated from the first portion 1a. The second portion 1b may be on the conductive layer 3 or may be on the first magnetic layer 2 and the conductive layer 3. The conductive layer 3 is nonmagnetic. The conductive layer 3 includes, for example, an conductor having a large spin orbit coupling. For example, tantalum (Ta) and platinum (Pt) are examples of such an conductor.

In the specification, one direction is taken as an X-direction. One direction perpendicular to the X-direction is taken as a Y-direction. A direction orthogonal to the X-direction and the Y-direction is taken as a Z-direction.

For example, the magnetic memory 100 is formed on a semiconductor substrate. For example, the major surface of the semiconductor substrate is taken to be the XY plane. The semiconductor substrate is not shown in FIG. 1.

A second magnetic layer 5 is provided on the second electrode 4b. The first magnetic layer 2 includes a third portion 1c at a location separated from the first portion 1a. In the example of FIG. 1, the second magnetic layer 5 is provided above the third portion 1c of the first magnetic layer 2 with the second electrode 4b interposed. The third portion 1c corresponds to a read head 6 of the magnetic memory 100. An insulating layer 7 is provided on the second magnetic layer 5. A third magnetic layer 8 is provided on the insulating layer 7. A coupling layer 9 is provided on the third magnetic layer 8. The coupling layer 9 is nonmagnetic. A fourth magnetic layer 10 is provided on the coupling layer 9. The third magnetic layer 8 is antiferromagnetically coupled to the fourth magnetic layer 10 with the nonmagnetic coupling layer 9 interposed. The orientation of the magnetization of the third magnetic layer 8 is the opposite of the orientation of the magnetization of the fourth magnetic layer 10. The third magnetic layer 8, the coupling layer 9, and the fourth magnetic layer 10 are included in a fifth magnetic layer 11 which has a synthetic anti-ferromagnetic (Sy-AF) structure. The insulating layer 7 is interposed between the second magnetic layer 5 and the fifth magnetic layer 11. The second magnetic layer 5, the insulating layer 7, and the fifth magnetic layer 11 form a magnetic tunnel junction (MTJ). The structure is a MT element. The read head 6 of the magnetic memory 100 includes the MTJ element. The MTJ element is marked with the reference numeral "MTJ" in the drawings attached to the specification.

The fifth magnetic layer 11 is a reference layer. The orientation of the magnetization of the reference layer (the fifth magnetic layer 11) is fixed. The second magnetic layer 5 is a free layer. The orientation of the magnetization of the free layer (the second magnetic layer 5) is changeable. The first magnetic layer 2 is a magnetic recording layer. The orientation of the magnetization of the magnetic recording layer (the first magnetic layer 2) is changeable. The magnetic recording layer (the first magnetic layer 2) is magnetostatically coupled to the second magnetic layer 5. In the example of FIG. 1, the orientations of the magnetizations of the free layer (the second magnetic layer 5) and the magnetic recording layer (the first magnetic layer 2) are aligned with the Z-direction. In the embodiment, the orientations of the magnetizations may intersect the Z-direction and are arbitrary. The orientations of the magnetizations are described as "upward" or "downward" for convenience.

The orientation of the magnetization of the magnetic recording layer (the first magnetic layer 2) is changeable to be one direction of "upward" or "downward." For example, multiple magnetic domains 13 that are partitioned by domain walls 12 are set in the first magnetic layer 2. The domain walls 12 occur inside the first magnetic layer 2 to cross the first magnetic layer 2. By setting the multiple magnetic domains 13 in the first magnetic layer 2, for example, two or more multiple pieces of information (data) can be recorded in the first magnetic layer 2. FIG. 1 shows an example in which four magnetic domains 13a, 13b, 13c, and 13d are set in the first magnetic layer 2. In such a case, four pieces of information are recorded in the first magnetic layer 2. In the example shown in FIG. 1, information in which the orientation of the magnetization is "upward" is recorded in the magnetic domain 13a and the magnetic domain 13d. Information corresponding to an orientation of the magnetization of "downward" is recorded in the magnetic domain 13b and the magnetic domain 13c.

The information that is recorded in the magnetic domains 13a to 13d is transmitted to the second magnetic layer (the free layer) 5 by magnetostatic coupling. The "orientation of the magnetization" of the magnetic domain below the second magnetic layer 5 is transmitted to the second magnetic layer 5. For example, as shown in FIG. 1, if the orientation of the magnetization of the magnetic domain 13d below the second magnetic layer 5 is "upward," for example, the orientation of the magnetization of the second magnetic layer 5 is switched "upward." If the orientation of the magnetization of the magnetic domain below the second magnetic layer 5 is "downward," for example, the orientation of the magnetization of the second magnetic layer 5 is switched "downward." For example, the resistance value of the MTJ element is low when the orientation of the magnetization of the second magnetic layer (the free layer) 5 and the orientation of the magnetization of the fifth magnetic layer (the reference layer) 11 are in a parallel state. Conversely, for example, the resistance value of the MTJ element is high when the orientation of the magnetization of the second magnetic layer (the free layer) 5 and the orientation of the magnetization of the fifth magnetic layer (the reference layer) 11 are in an antiparallel state. For example, the read head 6 reads whether the information recorded in the first magnetic layer (the magnetic recording layer) 2 is "1" or "0" according to the resistance value of the MTJ element.

The structure body 1 includes a fourth portion 1d. In the embodiment, the fourth portion 1d is on the conductive layer 3 side. A sixth magnetic layer 14 is provided in a state of being insulated from the structure body 1 at the fourth portion 1d. The fourth portion 1d corresponds to a write head 15 of the magnetic memory 100. The sixth magnetic layer 14 is ferromagnetic. The orientation of the magnetization of the sixth magnetic layer 14 is fixed. In the embodiment, the orientation of the magnetization of the sixth magnetic layer 14 is aligned with the X-direction. The sixth magnetic layer 14 applies a bias magnetic field to the first magnetic layer (the magnetic recording layer) 2 and the conductive layer 3. The bias magnetic field is utilized to reverse the orientation of the magnetization of the first magnetic layer 2 when writing the information. For example, the sixth magnetic layer 14 applies, to the first magnetic layer (the magnetic recording layer) 2, a magnetic field that makes it easy to reverse from the parallel state to the antiparallel state. A spin current is generated inside the conductive layer 3 by causing a current to flow in the conductive layer 3. When the spin current is generated inside the conductive layer 3, the spin is injected from the conductive layer 3 into the first magnetic layer (the magnetic recording layer) 2. The orientation of the magnetization of the first magnetic layer (the magnetic recording layer) 2 is determined by whether the spin injected from the conductive layer 3 is "upward" or "downward." The orientation of the spin injected from the conductive layer 3 can be determined by the orientation of the current caused to flow in the conductive layer 3. The magnetic memory 100 injects the spin from the conductive layer 3 into the first magnetic layer (the magnetic recording layer) 2 when writing the information. Such a writing method is, for example, a spin injection method.

As shown in FIG. 2, the first electrode 4a is connected to the second electrode 4b via a first parallel circuit 110a. The first parallel circuit 110a includes a first resistance unit r1a and a second resistance unit r2a. The first resistance unit r1a is the resistance component of the conductive layer 3 from the first electrode 4a to the second electrode 4b. The second resistance unit r2a is the resistance component of the first magnetic layer 2 from the first electrode 4a to the second electrode 4b. The resistance value of the first resistance unit r1a is lower than the resistance value of the second resistance unit r2a.

The third electrode 4c is connected to the first electrode 4a via a second parallel circuit 110b. The second parallel circuit 110b includes a third resistor r1b and a fourth resistor r2b. The third resistor r1b is the resistance component of the conductive layer 3 from the third electrode 4c to the first electrode 4a. The fourth resistor r2b is the resistance component of the first magnetic layer 2 from the third electrode 4c to the first electrode 4a. The resistance value of the third resistor r1b is lower than the fourth resistor r2b resistance value.

The second electrode 4b is connected to the third electrode 4c via the series circuit of the first parallel circuit 110a and the second parallel circuit 110b.

The magnetic memory 100 includes a circuit element 120. The circuit element 120 includes a first semiconductor layer 16 of a first conductivity type, a second semiconductor layer 17 of the first conductivity type, and a third semiconductor layer 18 of a second conductivity type. The first semiconductor layer 16 is electrically connected to the first electrode 4a. The second semiconductor layer 17 is electrically connected to the fifth magnetic layer 11. In the embodiment, the second semiconductor layer 17 is electrically connected to the fourth magnetic layer 10 of the fifth magnetic layer 11. The third semiconductor layer 18 is electrically connected to the first semiconductor layer 16 and the second semiconductor layer 17. In the embodiment, the first semiconductor layer 16 and the second semiconductor layer 17 are the p-type; and the third semiconductor layer 18 is the n-type. The first semiconductor layer 16 and the second semiconductor layer 17 are the anodes of diodes. The third semiconductor layer 18 is the cathodes of the diodes. The circuit element 120 includes diodes D1 and D2. The cathode of the diode D1 is connected to the cathode of the diode D2. Although the cathodes of the diodes D1 and D2 are connected to each other in the embodiment, the anodes of the diodes D1 and D2 may be connected to each other. For example, the diodes D1 and D2 are Zener diodes.

The magnetic memory 100 includes a first interconnect 130a, a second interconnect 130b, and a third interconnect 130c. The magnetic memory 100 further includes a first external terminal 140a, a second external terminal 140b, and a third external terminal 140c. The first external terminal 140a is electrically connected to the first interconnect 130a. The first interconnect 130a is electrically connected to the fifth magnetic layer 11 and the second semiconductor layer 17. In the embodiment, the first interconnect 130a is electrically connected to the fourth magnetic layer 10 of the fifth magnetic layer 11. The second external terminal 140b is electrically connected to the second interconnect 130b. The second interconnect 130b is electrically connected to the second electrode 4b. The third external terminal 140c is electrically connected to the third interconnect 130c. The third interconnect 130c is electrically connected to the third electrode 4c. The first external terminal 140a, the second external terminal 140b, and the third external terminal 140c are terminals that are connectable to a not-shown external circuit outside the magnetic memory 100. A circuit that includes a controller that controls the reading of the information, the writing of the information, etc., from and to the magnetic memory 100 is an example of the external circuit.

An example of operations of the magnetic memory 100 will now be described.

Figure 3:
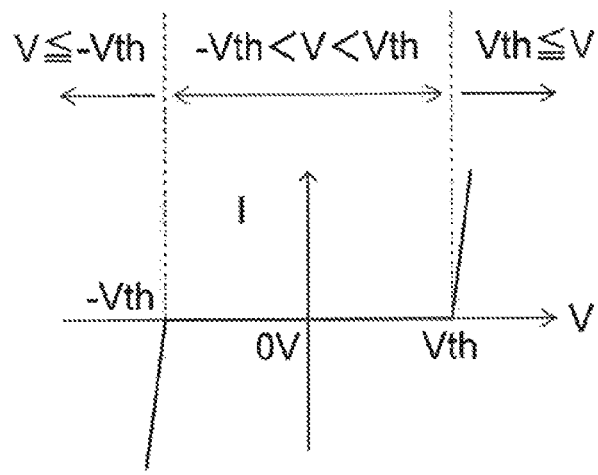
FIG. 3 is a schematic view showing a characteristic of a portion of the magnetic memory according to the first embodiment.

FIG. 3 is a schematic view showing a characteristic of a portion of the magnetic memory according to the first embodiment.

FIG. 3 shows a current-voltage characteristic of the circuit element 120.

As shown in FIG. 3, the circuit element 120 has a positive threshold Vth and a negative threshold −Vth. The voltage that is applied between the first interconnect 130a and the second interconnect 130b is an "interconnect-interconnect voltage V." A current I does not flow in the circuit element 120 when the interconnect-interconnect voltage V is in the range of "−Vth<V<Vth" and when "V<|Vth|."

When the interconnect-interconnect voltage V is "Vth≤V," the current I flows from the first interconnect 130a toward the second interconnect 130b in the circuit element 120. When the interconnect-interconnect voltage V is "V≤−Vth," the current I flows from the second interconnect 130b toward the first interconnect 130a in the circuit element 120.

Read Operation

A read operation is performed by setting an interconnect-interconnect voltage Vr so that "Vr<|Vth|." The external terminals that are used are, for example, the first external terminal 140a and the second external terminal 140b. In the read operation, a first potential difference is applied to the first external terminal 140a and the second external terminal 140b. The interconnect-interconnect voltage Vr is set so that "Vr<|Vth|" is satisfied based on the first potential difference.

Figure 4:
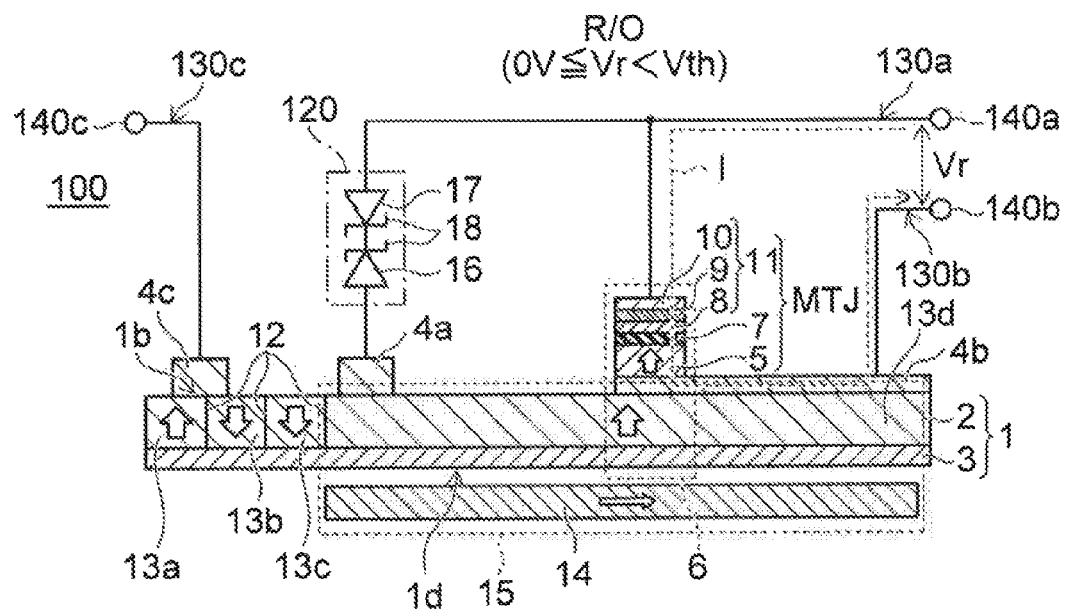
FIG. 4 is a schematic view showing an operation of the magnetic memory according to the first embodiment.

FIG. 4 is a schematic view showing an operation of the magnetic memory 100 according to the first embodiment.

FIG. 4 shows the read operation R/O of the magnetic memory 100.

FIG. 4 shows the case where a positive potential is applied to the first interconnect 130a and a voltage, for example, a ground potential (0 V), that is lower than the first interconnect 130a is applied to the second interconnect 130b. The interconnect-interconnect voltage Vr is set so that "0 V≤Vr<Vth." In such a case, the current I flows from the first interconnect 130a toward the second interconnect 130b via the read head 6. The value of the current I changes according to the resistance value of the MTJ element of the read head 6. The value of the current I is large when the resistance value of the MTJ element is low; and the value of the current I is small when the resistance value of the MTJ element is high. It is determined whether, for example, the information recorded in the magnetic domain 13d of the magnetic recording layer (the first magnetic layer 2) is "1" or "0" based on the magnitude of the value of the current I.

In the magnetic memory 100, the voltage drop of the MTJ element may be set to be higher than the interconnect-interconnect voltage Vr. In such a case, the current I does not flow. It is determined whether the information recorded in the magnetic domain 13d is "1" or "0" based on whether the current I flows or does not flow.

In the example of the read operation R/O shown in FIG. 4, the potential of the second interconnect 130b is set to be lower than that of the first interconnect 130a. However, the potential of the second interconnect 130b may be set to be higher than that of the first interconnect 130a. In such a case, the current I flows from the second interconnect 130b toward the first interconnect 130a via the MTJ element. Specifically, a positive potential is applied to the second interconnect 130b; and 0 V is applied to the first interconnect 130a. Or, 0 V is applied to the second interconnect 130b; and a negative potential is applied to the first interconnect 130a. In such a case as well, it is determined whether the information is "1" or "0" based on the magnitude of the value of the current I or whether the current I flows or does not flow.

Write Operation

A write operation is performed by setting an interconnect-interconnect voltage Vw so that "Vth≤Vw" or "−Vw≤−Vth" is satisfied according to the information to be written. The external terminals that are used are, for example, the first external terminal 140a and the second external terminal 140b. In the write operation, a second potential difference is applied to the first external terminal 140a and the second external terminal 140b. The interconnect-interconnect voltage Vw is set so that "Vth≤Vw" or "−Vw≤−Vth" is satisfied based on the second potential difference.

Figure 5:
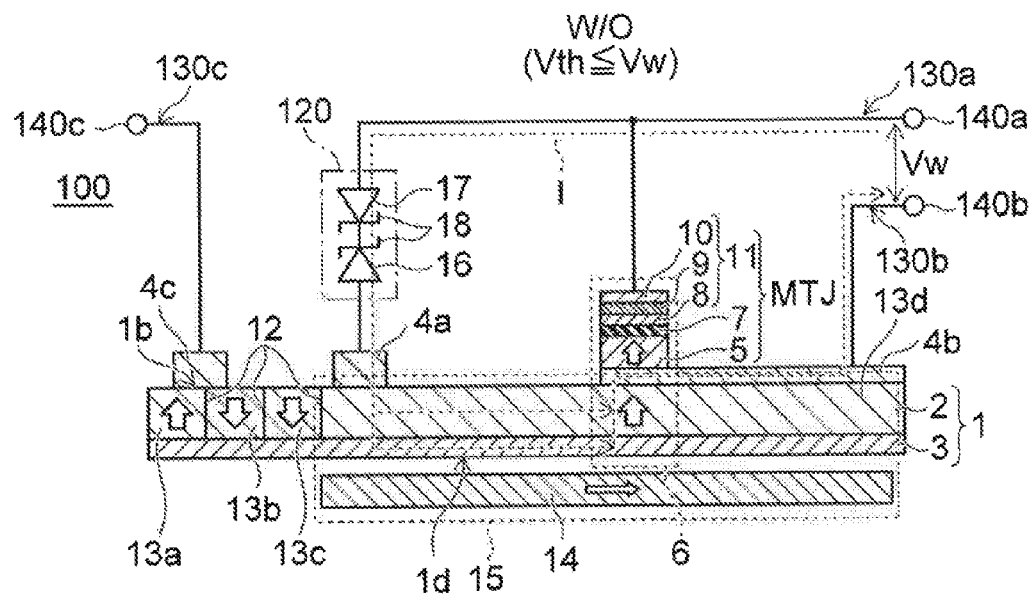
FIG. 5 is a schematic view showing an operation of the magnetic memory according to the first embodiment.

FIG. 5 is a schematic view showing an operation of the magnetic memory according to the first embodiment.

FIG. 5 shows the write operation W/O of the magnetic memory 100.

FIG. 5 shows the case where the interconnect-interconnect voltage Vw is set so that "Vth≤Vw."

For example, the state shown in FIG. 5 is obtained by applying a positive potential that is not less than the positive threshold Vth to the first interconnect 130a and applying a potential of the ground potential (0 V) to the second interconnect 130b. The current I flows from the first interconnect 130a toward the second interconnect 130b via the circuit element 120. At this time, in the conductive layer 3, the current I flows from the first electrode 4a toward the second electrode 4b via at least the conductive layer 3. Thereby, the spin is injected from the conductive layer 3 into the first magnetic layer 2. Thereby, for example, the orientation of the magnetization of the magnetic domain 13a of the first magnetic layer 2 is switched "upward." The information that corresponds to an "upward" orientation of the magnetization is written to the magnetic domain 13a.

In the case where information that corresponds to a "downward" orientation of the magnetization is written to the magnetic domain 13a, it is sufficient for the interconnect-interconnect voltage Vw to be set so that "−Vth≤−Vw." For example, to set the interconnect-interconnect voltage Vw so that "−Vth≤−Vw," it is sufficient to apply the ground potential (0 V) to the first interconnect 130a and apply a positive potential that is not less than the positive threshold Vth to the second interconnect 130b. Or, it is sufficient to apply a negative potential that is not more than the negative threshold −Vth to the first interconnect 130a and apply the ground potential (0 V) to the second interconnect 130b. The current I flows through the circuit element 120 from the second interconnect 130b toward the first interconnect 130a via at least the conductive layer 3. At this time, the current I flows in the conductive layer 3 from the second electrode 4b toward the first electrode 4a. A spin of the reverse orientation of that of the state shown in FIG. 5 is injected from the conductive layer 3 into the first magnetic layer 2. Thereby, for example, the orientation of the magnetization of the magnetic domain 13a of the first magnetic layer 2 is switched "downward." The information that corresponds to a "downward" orientation of the magnetization is written to the magnetic domain 13a.

Shift Operation

A shift operation is performed by setting an interconnect-interconnect voltage Vsf so that "Vw<Vsf" or "−Vsf<−Vw" is satisfied according to the direction of the shift. The interconnect-interconnect voltage Vsf is a voltage between the second interconnect 130b and the third interconnect 130c. The external terminals that are used are, for example, the second external terminal 140b and the third external terminal 140c. In the shift operation, a third potential difference is applied to the second external terminal 140b and the third external terminal 140c. The interconnect-interconnect voltage Vsf is set so that "Vw<Vsf" or "−Vsf<−Vw" is satisfied based on the third potential difference.

Figure 6:
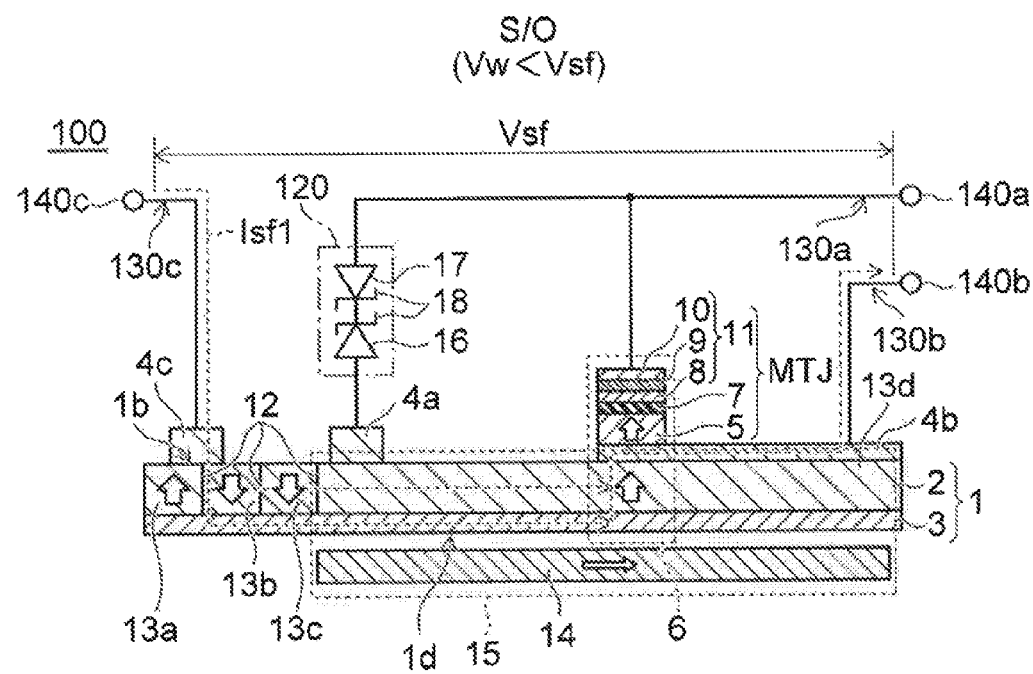
FIG. 6 is a schematic view showing an operation of the magnetic memory according to the first embodiment.

FIG. 6 is a schematic view showing an operation of the magnetic memory according to the first embodiment.

FIG. 6 shows the shift operation S/O of the magnetic memory 100.

FIG. 6 shows the case where the Interconnect-interconnect voltage Vsf is set so that "Vw<Vsf."

"Vw<Vst" is the case where the potential of the third interconnect 130c is set to be higher than the second interconnect 130b. "−Vsf<−Vw" is the case where the potential of the third interconnect 130c is set to be lower than the second interconnect 130b. In the shift operation S/O, for example, the potential of the second interconnect 130b is fixed at the ground potential (e.g., 0 V); and the potential of the third interconnect 130c is set to a positive potential or a negative potential according to the direction in which the information is to be shifted. Or, the potential of the second interconnect 130b and the potential of the third interconnect 130c are interchanged according to the direction in which the information is to be shifted.

When "Vw<Vsf," a first shift current Isf1 flows from the third electrode 4c toward the second electrode 4b via the first magnetic layer 2 and the conductive layer 3 (referring to FIG. 6). The domain walls 12 are shifted from the third electrode 4c side toward the second electrode 4b side by the first shift current Isf1 flowing in the first magnetic layer 2 through the domain walls 12. The magnetic domains 13a to 13d are shifted from the third electrode 4c toward the second electrode 4b.

When "-Vsf<Vw," a second shift current Isf2 of the reverse orientation flows from the second electrode 4b toward the third electrode 4c via the first magnetic layer 2 and the conductive layer 3 (the second shift current Isf2 in particular is not shown). The domain walls 12 are shifted from the second electrode 4b side toward the third electrode 4c side by the second shift current Isf2 flowing in the first magnetic layer 2 through the domain walls 12. The magnetic domains 13a to 13d are shifted from the second electrode 4b toward the third electrode 4c.

For example, the interconnect-interconnect voltages Vsf and -Vsf are applied in pulse form. The first shift current Isf1 or the second shift current Isf2 flows while the interconnect-interconnect voltage Vsf or -Vsf is applied in pulse form. The domain walls 12 move while the first shift current Isf1 and the second shift current Isf2 flow. The distance that the domain walls 12 move in one pulse is, for example, the distance of one of the magnetic domains 13a to 13d. However, the distance that the domain walls 12 move in one pulse is not limited thereto.

FIG. 6 shows the case where the magnetic domain 13c is at the read head 6. When it is desired to shift from the magnetic domain 13c to the magnetic domain 13b at the read head 6, for example, one pulse of the interconnect-interconnect voltage Vsf is applied. Thereby, the magnetic domain 13b is shifted to the read head 6. When it is desired to shift from the magnetic domain 13c to the magnetic domain 13d at the read head 6, for example, one pulse of the interconnect-interconnect voltage -Vsf is applied. Thereby, the magnetic domain 13d is shifted to the read head 6. Such an operation is performed also when shifting the magnetic domains 13a to 13d to the write head 15.

In the shift operation S/O, the magnetic domain of the magnetic domains 13a to 13d in which the information to be read is recorded is shifted to the read head 6. Or, the magnetic domain of the magnetic domains 13a to 13d in which the information is to be written is shifted to the write head 15.

During the shift operation S/O, the first shift current Isf1 and the second shift current Isf2 flow not only in the first magnetic layer 2 but also in the conductive layer 3. The current flowing in the conductive layer 3 is similar to that of the write operation W/O. The current differs in that the domain walls 12 move or are stopped in the first magnetic layer 2. If the domain walls 12 are moving, the spin injection into the first magnetic layer 2 is suppressed even if a current flows in the conductive layer 3.

In other words, the domain walls 12 are stopped during the write operation W/O. Thereby, the spin injection into the first magnetic layer 2 is promoted. The domain walls 12 are caused to move during the shift operation S/O. Thereby, the spin injection into the first magnetic layer 2 is suppressed. Whether the domain walls 12 are stopped or caused to move can be controlled by the magnitude of the current caused to flow in the first magnetic layer 2.

According to such a magnetic memory 100 according to the first embodiment, a domain wall memory (hereinbelow, called a spin injection domain wall memory) is provided in which the method for writing the information is a spin injection method.

According to the magnetic memory 100 according to the first embodiment, the read operation R/O is performed based on the first potential difference applied to the first external terminal 140a and the second external terminal 140b. The write operation W/O also is performed based on the second potential difference applied to the first external terminal 140a and the second external terminal 140b. Therefore, the external terminals may not be separately used between the read operation R/O and the write operation W/O. Accordingly, the number of external terminals in the magnetic memory 100 according to the first embodiment can be reduced compared to a magnetic memory in which the external terminals are used separately between the read operation R/O and the write operation W/O.

The sixth magnetic layer 14 is provided at the fourth portion 1d between the first portion 1a of the structure body 1 and the second portion 1b of the structure body 1. Therefore, for example, the magnetic memory 100 can record multiple pieces of information in the first magnetic layer 2 between the first portion 1a and the second portion 1b of the structure body 1.

The third electrode 4c is electrically connected to the second portion 1b of the structure body 1. Therefore, the first magnetic layer 2 of the structure body 1 can be used as a magnetic recording layer that records multiple information of the domain wall memory.

A potential is applied to the first interconnect 130a not only when the read operation R/O is performed but also when the write operation W/O is performed. Therefore, in a memory cell array in which the magnetic recording layer (the first magnetic layer 2), the read head 6, and the write head 15 are integrated, the interconnects for the read operation R/O and the interconnects for the write operation W/O may not be provided separately. Accordingly, the integration of the memory cell array in the magnetic memory 100 can be increased compared to a magnetic memory that includes the interconnects for the read operation R/O and the interconnects for the write operation W/O inside the memory cell array.

A higher TMR ratio is desirable for the MTJ element of the read head 6. Thereby, the design/manufacturing margin of the magnetic memory 100 is larger. To obtain a high TMR ratio, the difference between the resistance values of the high resistance state and the low resistance state is increased. However, in the case where the resistance value in the high resistance state is too high, the current does not flow easily in the MTJ element in the write operation W/O; and the writing characteristics of the MTJ element degrade.

For such a circumstance, the magnetic memory 100 does not cause a current to flow in the MTJ element in the write operation W/O. Therefore, compared to the case where a current is caused to flow in the MT) element in the write operation W/O, the resistance value in the high resistance state can be increased without causing the writing characteristics to degrade. Accordingly, the design/manufacturing margin of the magnetic memory 100 can be larger.

When the interconnect-interconnect voltage Vw is not less than the positive threshold Vth or not less than the negative threshold −Vth of the circuit element 120, the magnetic memory 100 can write the information regardless of the resistance value of the MTJ element. Therefore, it is possible to increase the resistance value of the MTJ element to a value such that conduction does not occur at the interconnect-interconnect voltage Vw applied in the write operation.

In the magnetic memory 100, the first magnetic layer (the magnetic recording layer) 2 is magnetostatically coupled to the second magnetic layer (the free layer) 5. The information that is recorded in the magnetic domains 13a to 13d of the first magnetic layer 2 is transmitted to the second magnetic layer 5 by the magnetostatic coupling of the read head 6. In the case where the orientation of the magnetization is transmitted from the first magnetic layer (the magnetic recording layer) 2 to the second magnetic layer (the free layer) 5 by magnetostatic coupling, it is favorable for the fifth magnetic layer (the reference layer) 11 to have a synthetic anti-ferromagnetic (Sy-AF) structure. The Sy-AF structure can fix the orientation of the magnetization securely. Therefore, the reverse of the magnetization of the fifth magnetic layer (the reference layer) 11 due to the magnetostatic coupling can be suppressed. By providing the fifth magnetic layer (the reference layer) 11 of the magnetic memory 100 with the Sy-AF structure, the design/manufacturing margin of the magnetic memory 100 is even larger.

Thus, according to the magnetic memory 100 according to the first embodiment, a magnetic memory can be provided in which it is possible to reduce the number of external terminals, improve the integration, and enlarge the design/manufacturing margin.

A modification of the first embodiment will now be described.

First Embodiment: Modification

Figure 7:
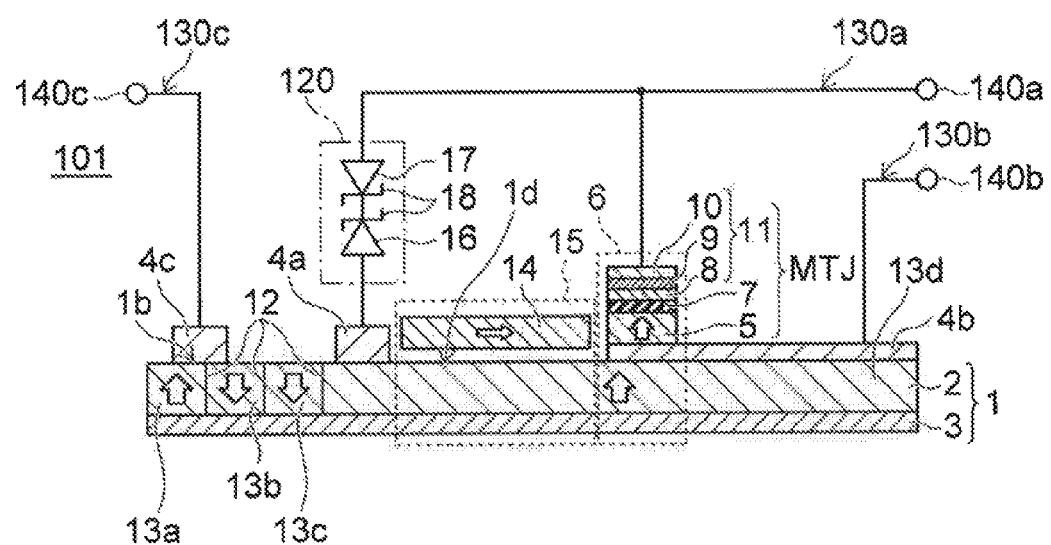
FIG. 7 is a schematic cross-sectional view showing a magnetic memory according to a modification of the first embodiment.

FIG. 7 is a schematic cross-sectional view showing a magnetic memory according to a modification of the first embodiment.

As shown in FIG. 7, the magnetic memory 101 according to the first modification is an example in which the sixth magnetic layer 14 that is included in the write head 15 is provided on the first magnetic layer 2 side instead of the conductive layer 3 side.

For example, the sixth magnetic layer 14 can be provided on the first magnetic layer 2 side in the case where the write head 15 is provided to be separated from the read head 6.

Second Embodiment

A second embodiment relates to an example of the case where the magnetic memory 100 according to the first embodiment is integrated in a memory cell array.

Figure 8:
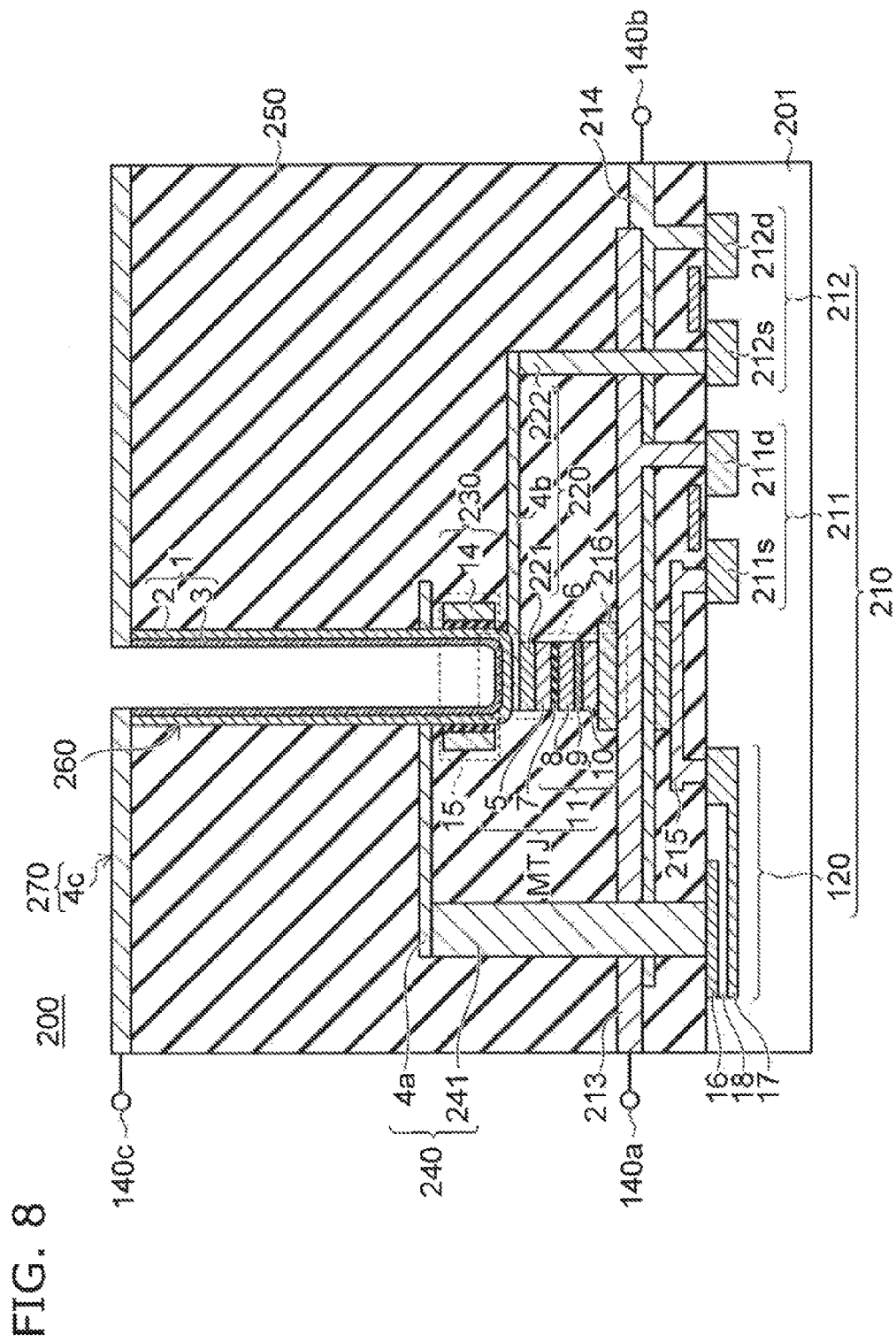
FIG. 8 is a schematic cross-sectional view showing a magnetic memory according to a second embodiment.

FIG. 8 is a schematic cross-sectional view showing the magnetic memory.

As shown in FIG. 8, the magnetic memory 200 according to the second embodiment includes a semiconductor structure 210, the magnetic tunnel junction structure MT), a first electrode structure 220, a bias structure 230, a second electrode structure 240, an insulating film 250, a memory hole 260, the structure body 1, and a third electrode structure 270.

The semiconductor structure 210 is provided in a semiconductor substrate 201. The semiconductor structure 210 includes a first transistor 211, a second transistor 212, and the circuit element 120. The first transistor 211, the second transistor 212, and the circuit element 120 are provided in the semiconductor substrate 201. The conductivity type of the semiconductor substrate 201 is, for example, the p-type. The first transistor 211 and the second transistor 212 that are provided in the p-type semiconductor substrate 201 are n-channel insulated gate-type FETs. A silicon substrate is an example of the semiconductor substrate 201.

One end, e.g., an n-type drain region 211d, of the current path of the first transistor 211 is electrically connected to the first external terminal 140a via a first lateral interconnect 213. One end, e.g., an n-type drain region 212d, of the current path of the second transistor 212 is electrically connected to the second external terminal 140b via a second lateral interconnect 214.

The circuit element 120 includes the first semiconductor layer 16 of the first conductivity type, the second semiconductor layer 17 of the first conductivity type, and the third semiconductor layer 18 of the second conductivity type. In the embodiment, the first conductivity type is the n-type; and the second conductivity type is the p-type. The n-type and the p-type may be reversed. The n-type second semiconductor layer 17 is provided inside the semiconductor substrate 201, which is of the p-type, and is electrically connected to the other end, e.g., an n-type source region 211s, of the first transistor 211 via, for example, a third lateral interconnect 215. A first vertical interconnect 216 is provided on the third lateral interconnect 215. For example, the p-type third semiconductor layer 18 is provided inside the n-type second semiconductor layer 17 and is electrically connected to the n-type second semiconductor layer 17 via a p-n junction. For example, the n-type first semiconductor layer 16 is provided inside the p-type third semiconductor layer 18 and is electrically connected to the p-type third semiconductor layer 18 via a p-n junction.

In the example shown in FIG. 8, the first interconnect 130a includes the first lateral interconnect 213, the current path of the first transistor 211, and the third lateral interconnect 215. The second interconnect 130b includes the second lateral interconnect 214 and the current path of the second transistor 212.

The magnetic tunnel junction structure MTJ is provided above the semiconductor structure 210. The magnetic tunnel junction structure MTJ includes the second magnetic layer 5, the insulating layer 7, and the fifth magnetic layer 11. The fifth magnetic layer 11 includes the third magnetic layer 8, the coupling layer 9, and the fourth magnetic layer 10. The fifth magnetic layer 11 has a Sy-AF structure. The fourth magnetic layer 10 that is included in the fifth magnetic layer 11 is provided on the first vertical interconnect 216. The fourth magnetic layer 10 is electrically connected to the n-type source region 211s and the second semiconductor layer 17 via the first vertical interconnect 216 and the third lateral interconnect 215. The coupling layer 9 is provided on the fourth magnetic layer 10. The third magnetic layer 8 is provided on the coupling layer 9. The insulating layer 7 is provided on the third magnetic layer 8. The second magnetic layer 5 is provided on the insulating layer 7.

The first electrode structure 220 is provided above the magnetic tunnel junction structure MTJ. The first electrode structure 220 is electrically connected to the second magnetic layer 5 and the other end, e.g., an n-type source region 212s, of the current path of the second transistor 212. In the embodiment, the first electrode structure 220 includes the second electrode 4b, a connection electrode 221, and a second vertical interconnect 222. The second electrode 4b is electrically connected to the connection electrode 221 and the second vertical interconnect 222. The connection electrode 221 is provided on the second magnetic layer 5 and electrically connects the second electrode 4b to the second magnetic layer 5. The second vertical interconnect 222 is provided on the source region 212s and connects the second electrode 4b to the source region 212s.

The bias structure 230 is provided above the first electrode structure 220. The bias structure 230 includes the sixth magnetic layer 14. The write head 15 includes the bias structure 230.

The second electrode structure 240 is provided above the bias structure 230. The second electrode structure 240 is electrically connected to the first semiconductor layer 16. In the embodiment, the second electrode structure 240 includes the first electrode 4a and a third vertical interconnect 241. The first electrode 4a is electrically connected to the third vertical interconnect 241. The third vertical interconnect 241 is provided on the first semiconductor layer 16 and electrically connects the first electrode 4a to the first semiconductor layer 16.

The insulating film 250 is provided above the second electrode structure 240. The insulating film 250 is an inter-layer insulating film that electrically insulates the structure in which the magnetic memory 200 is included. A simplified inter-layer insulating film is shown in FIG. 8. The method for manufacturing the inter-layer insulating film is described below in detail.

A memory hole 260 is provided in the insulating film 250. The first electrode structure 220 is exposed at the bottom portion of the memory hole 260. The second electrode structure 240 is exposed at the side portion of the memory hole 260.

The structure body 1 is provided inside the memory hole 260. The structure body 1 includes the first magnetic layer 2 and the conductive layer 3. In the embodiment, the first magnetic layer 2 is provided on the inner wall including the bottom portion and the side portion of the memory hole 260. The first magnetic layer 2 is electrically connected to the first electrode structure 220 at the bottom portion of the memory hole 260. In the embodiment, the first magnetic layer 2 is electrically connected to the second electrode 4b. The first magnetic layer 2 is electrically connected to the second electrode structure 240 at the side portion of the memory hole 260. In the embodiment, the first magnetic layer 2 is electrically connected to the first electrode 4a. The conductive layer 3 is provided on the first magnetic layer 2. The read head 6 includes the first magnetic layer 2, the second electrode 4b, the connection electrode 221, the second magnetic layer 5, the insulating layer 7, and the fifth magnetic layer at the bottom portion of the memory hole 260. The first magnetic layer 2 is magnetostatically coupled to the second magnetic layer 5 at the bottom portion of the memory hole 260.

The third electrode structure 270 is provided on the Insulating film 250. The third electrode structure 270 is electrically connected to the structure body 1. The third electrode structure 270 includes the third electrode 4c. For example, the third electrode 4c is electrically connected to the upper end of the memory hole 260. The third electrode 4c is electrically connected to the third external terminal 140c.

An example of operations of the magnetic memory 200 will now be described.

The operations of the magnetic memory 200 are similar to the operations of the magnetic memory 100 shown in FIG. 1.

Accordingly, the current paths in the read operation, in the write operation, and in the shift operation will now be described.

Read Operation

Figure 9:
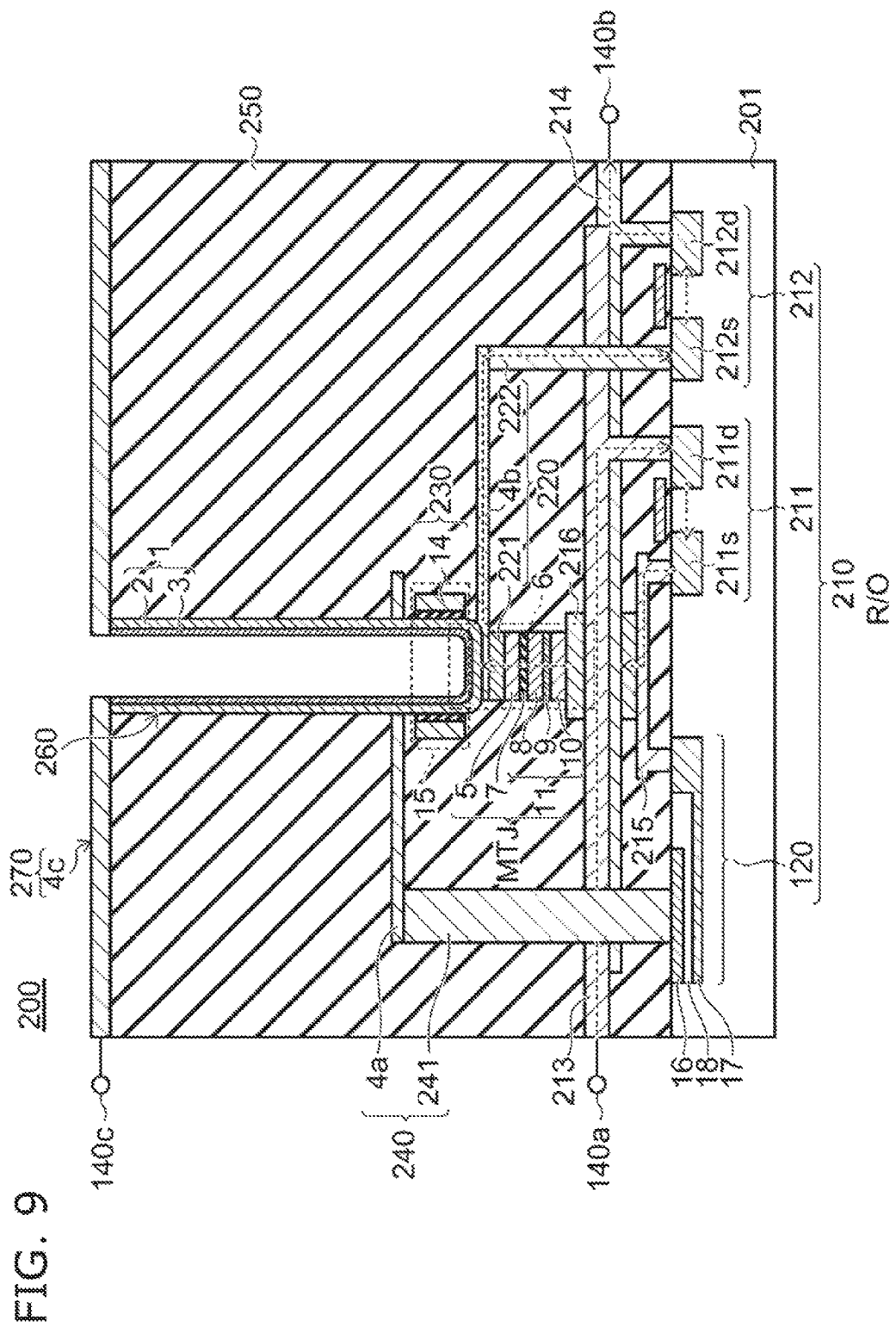
FIG. 9 is a schematic view showing an operation of the magnetic memory according to the second embodiment.

FIG. 9 is a schematic view showing an operation of the magnetic memory 200 according to the second embodiment.

FIG. 9 shows the read operation R/O.

In the read operation R/O as shown in FIG. 9, the current path is, for example, the first external terminal 140a to the first lateral interconnect 213 to the drain region 211d to the source region 211s to the third lateral interconnect 215 to the first vertical interconnect 216 to the read head 6 to the second electrode 4b to the second vertical interconnect 222 to the source region 212s to the drain region 212d to the second lateral interconnect 214 to the second external terminal 140b. The current path is via the MTJ to the connection electrode 221 in the read head 6.

Write Operation

Figure 10:
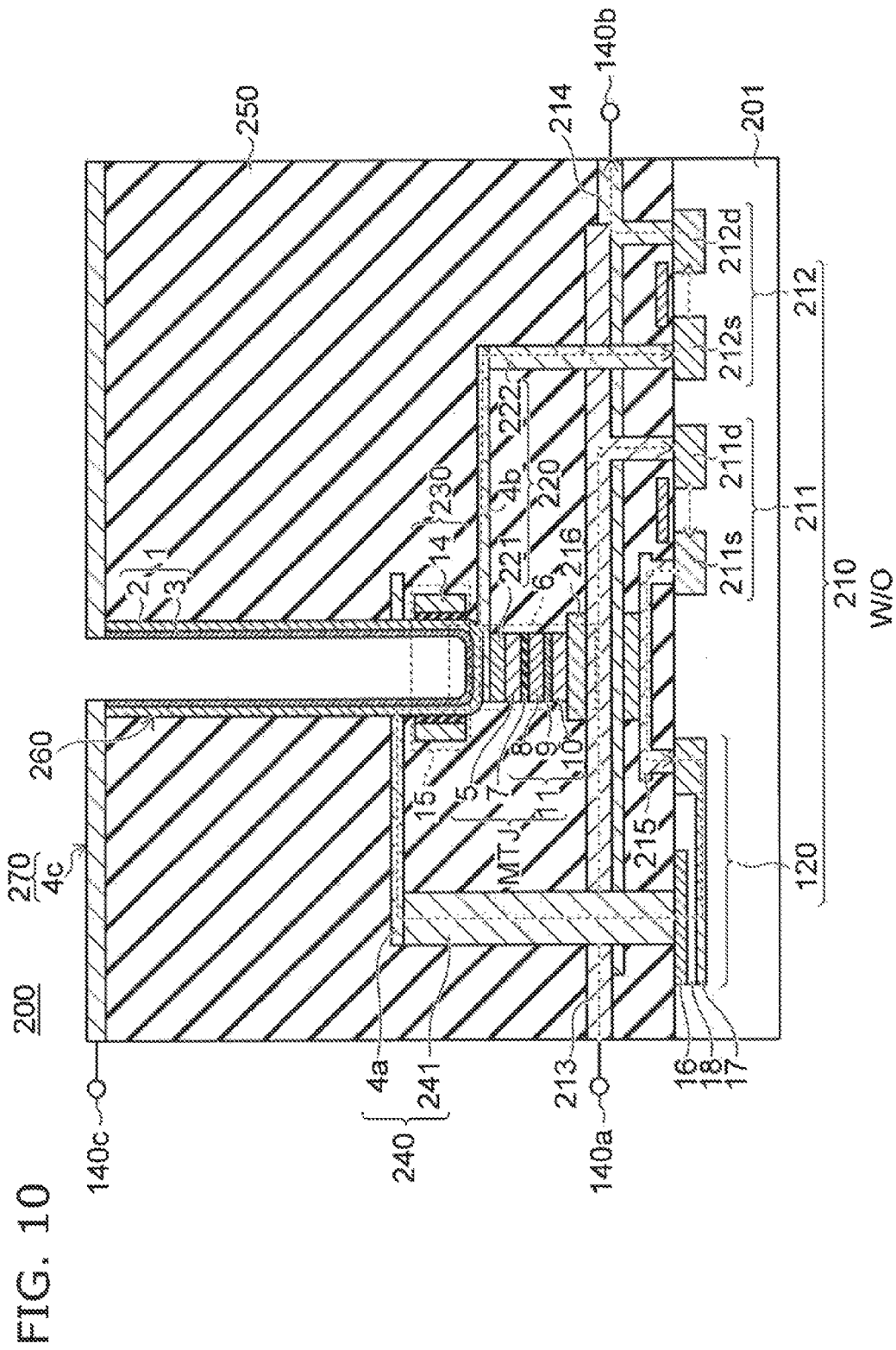
FIG. 10 is a schematic view showing an operation of the magnetic memory according to the second embodiment.

FIG. 10 is a schematic view showing an operation of the magnetic memory 200 according to the second embodiment.

FIG. 10 shows the write operation W/O.

In the write operation W/O as shown in FIG. 10, the current path is, for example, the first external terminal 140a to the first lateral interconnect 213 to the drain region 211d to the source region 211s to the third lateral interconnect 215 to the circuit element 120 to the third vertical interconnect 241 to the first electrode 4a to the conductive layer 3 to the write head 15 to the second electrode 4b to the second vertical interconnect 222 to the source region 212s to the drain region 212d to the second lateral interconnect 214 to the second external terminal 140b. The current path may be the reverse of the case shown in FIG. 10 according to the information to be written.

Shift Operation

Figure 11:
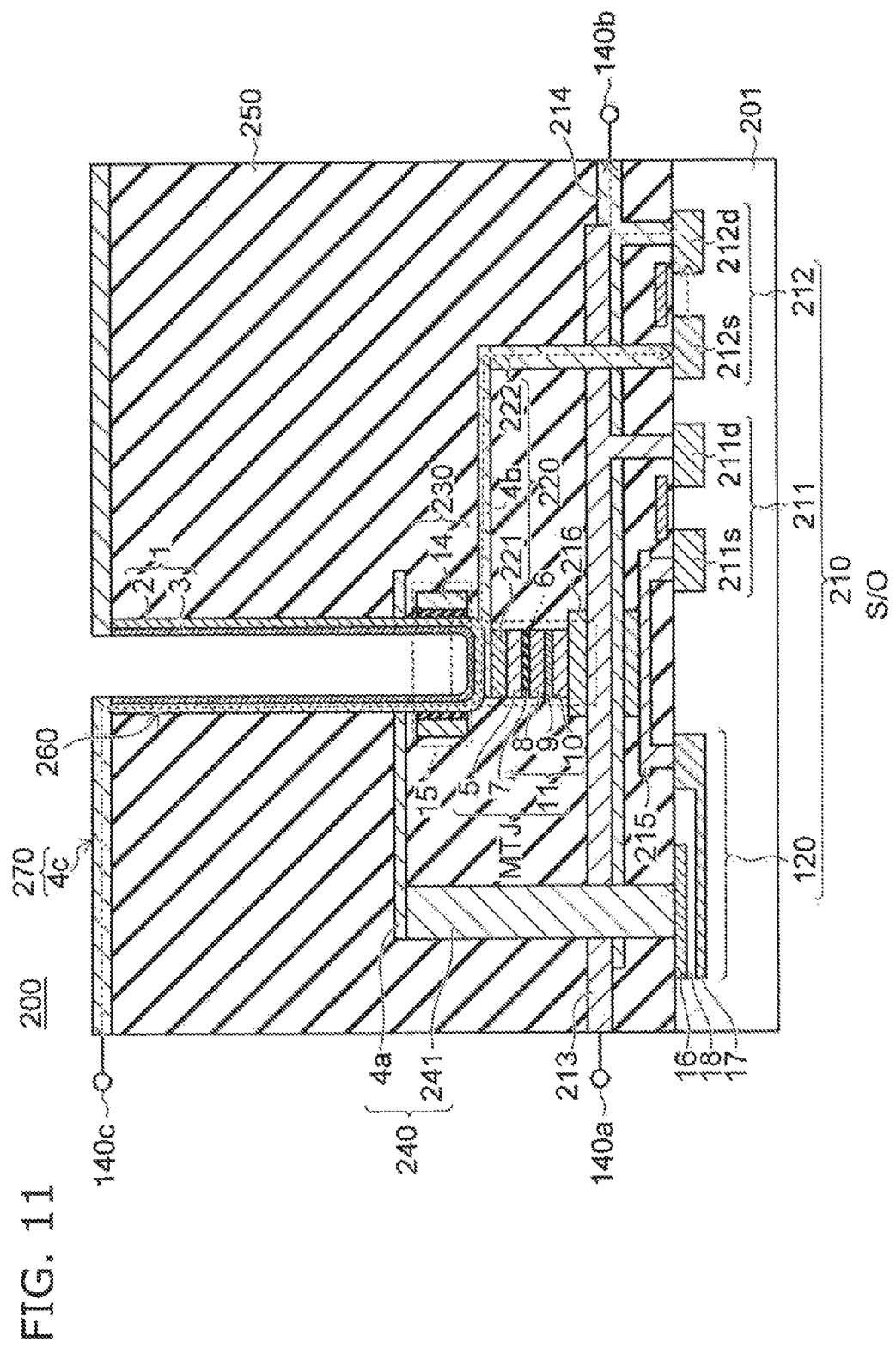
FIG. 11 is a schematic view showing an operation of the magnetic memory according to the second embodiment.

FIG. 11 is a schematic view showing an operation of the magnetic memory 200 according to the second embodiment.

FIG. 11 shows the write operation W/O.

In the shift operation S/O as shown in FIG. 11, the current path is, for example, the third external terminal 140c to the first magnetic layer 2 to the second electrode 4b to the second vertical interconnect 222 to the source region 212s to the drain region 212d to the second lateral interconnect 214 to the second external terminal 140b. The current path may be the reverse of the case shown in FIG. 11 according to the direction in which the information is to be shifted.

An example of a method for manufacturing the magnetic memory 200 will now be described.

For example, the magnetic memory 200 can be manufactured using the basic sequence of 1 to 8 recited below.

1. Form the semiconductor structure 210
2. Form the magnetic tunnel junction structure (the first magnetic structure) MTJ
3. Form the first electrode structure 220
4. Form the bias structure (the second magnetic structure) 230
5. Form the second electrode structure 240
6. Form the memory hole 260
7. Form the structure body 1
8. Form the third electrode structure 270

The sequence of 1 to 8 will now be described with reference to the drawings.

FIG. 12 to FIG. 19 are schematic cross-sectional views showing the manufacturing processes of the magnetic memory 200 according to the second embodiment.

1. Form the Semiconductor Structure 210

Figure 12:
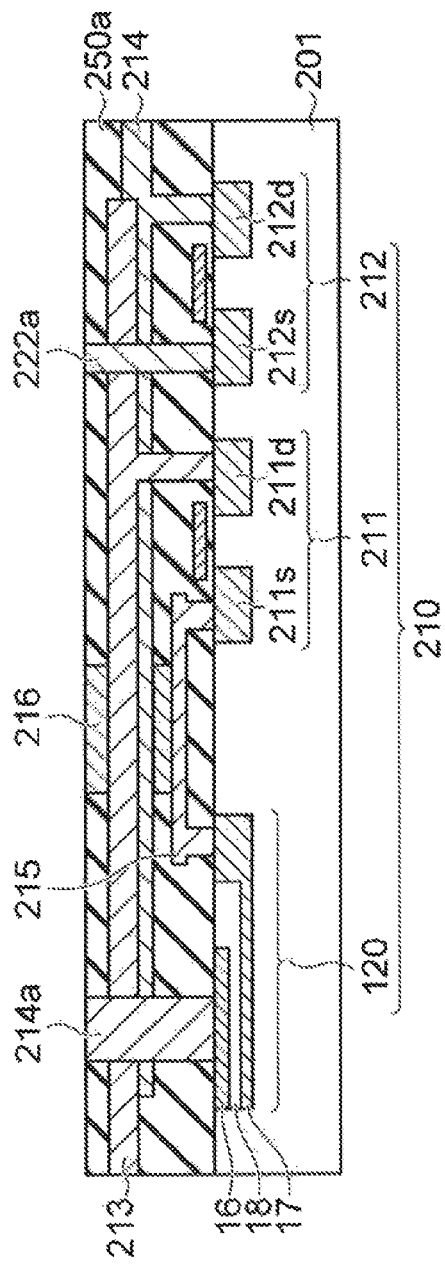
FIG. 12 to FIG. 19 are schematic cross-sectional views showing the manufacturing processes of the magnetic memory according to the second embodiment.

As shown in FIG. 12, the semiconductor structure 210 is formed in the semiconductor substrate 201. The semiconductor structure 210 includes the first transistor 211, the second transistor 212, and the circuit element 120. It is sufficient to form the semiconductor structure 210 according to a well-known method. The conductivity type of the semiconductor substrate 201 is the p-type. In such a case, the n-type source region 211s and the n-type drain region 211d of the first transistor 211, the n-type source region 212s and the n-type drain region 212d of the second transistor 212, and the n-type second semiconductor layer 17 of the circuit element 120 are formed inside the semiconductor substrate 201. The p-type third semiconductor layer 18 is formed inside the n-type second semiconductor layer 17. The n-type first semiconductor layer 16 is formed inside the p-type semiconductor layer 18. Thereby, the semiconductor structure 210 is formed in the semiconductor substrate 201.

After forming the semiconductor structure 210, the third lateral interconnect 215 is formed above the semiconductor substrate 201. Continuing, the first lateral interconnect 213 and the second lateral interconnect 214 are formed above the semiconductor substrate 201 and the third lateral interconnect 215. For example, the first lateral interconnect 213 exists in the same plane as the second lateral interconnect 214. In FIG. 12 to FIG. 19, the second lateral interconnect 214 and the first lateral interconnect 213 are drawn as being shifted so that the second lateral interconnect 214 does not overlap the first lateral interconnect 213. Continuing, a first insulating film 250a is formed on the first lateral interconnect 213 and the second lateral interconnect 214. Continuing, the first vertical interconnect 216, a first-level second vertical interconnect 222a, and a first-level third vertical interconnect 241a are formed in the insulating film 250a. The first vertical interconnect 216 is electrically connected to the third lateral interconnect 215. The first-level second vertical interconnect 222a is electrically connected to the source region 212s. The first-level third vertical interconnect 241a is electrically connected to the first semiconductor layer 16.

2. Form the Magnetic Tunnel Junction Structure

Figure 13:
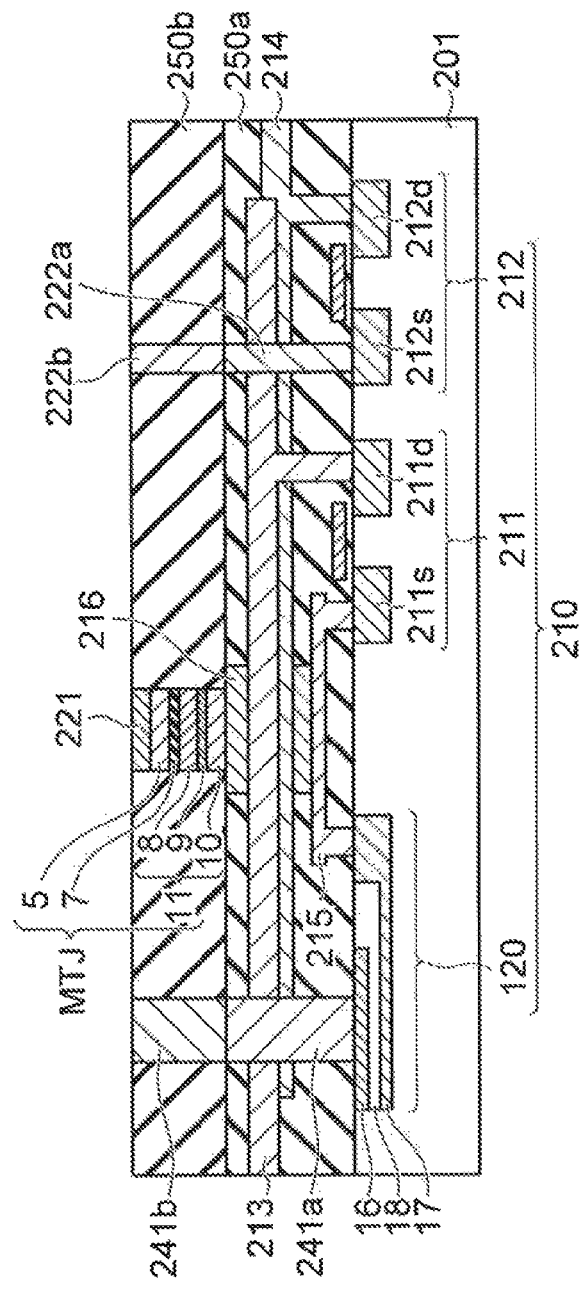

As shown in FIG. 13, a magnetic film that is used to form the fourth magnetic layer 10 is formed on the first insulating film 250a, the first vertical interconnect 216, the first-level second vertical interconnect 222a, and the first-level third vertical interconnect 241a. Continuing, a nonmagnetic film that is used to form the coupling layer 9 is formed on the magnetic film. Continuing, a magnetic film that is used to form the third magnetic layer 8 is formed on the nonmagnetic film. Continuing, an insulating film that is used to form the insulating layer 7 is formed on the magnetic film. Continuing, a magnetic film that is used to form the second magnetic layer 5 is formed on the insulating film. Continuing, a conductor film that is used to form the connection electrode 221 is formed on the magnetic film. Thereby, a stacked body is formed on the first insulating film 250a, the first vertical interconnect 216, the first-level second vertical interconnect 222a, and the first-level third vertical interconnect 241a. Continuing, the stacked body is patterned. The fifth magnetic layer 11 that includes the fourth magnetic layer 10, the coupling layer 9, and the third magnetic layer 8 is formed on the first vertical interconnect 216. The insulating layer 7, the second magnetic layer 5, and the connection electrode 221 are formed on the fifth magnetic layer 11. Thereby, the magnetic tunnel junction structure MTJ is formed on the first vertical interconnect 216. The magnetic tunnel junction structure MTJ includes the fifth magnetic layer 11, the insulating layer 7, and the second magnetic layer 5.

A second insulating film 250b is formed on the first insulating film 250a, the magnetic tunnel junction structure MTJ, the first-level second vertical interconnect 222a, and the first-level third vertical interconnect 241a. Continuing, for example, the front surface of the second insulating film 250b is caused to recede to the front surface of the connection electrode 221. The front surface of the second insulating film 250b is planarized. For example, chemical mechanical polishing (CMP) is used when planarizing the front surface of the second insulating film 250b. In the CMP, the connection electrode 221 functions as a protective layer that protects the magnetic tunnel junction structure MTJ. For example, the magnetic tunnel junction structure MTJ is protected by the connection electrode 221 from the shock and polishing of the CMP.

A second-level second vertical interconnect 222b and a second-level third vertical interconnect 241b are formed in the second insulating film 250b. The second-level second vertical interconnect 222b is electrically connected to the first-level second vertical interconnect 222a. The second-level third vertical interconnect 241b is electrically connected to the first-level third vertical interconnect 241a. For example, the second-level second vertical interconnect 222b and the second-level third vertical interconnect 241b are filled by CMP into holes formed in the second insulating film 250b. The connection electrode 221 protects the magnetic tunnel junction structure MTJ in the CMP as well.

3. Form the First Electrode Structure 220

Figure 14:
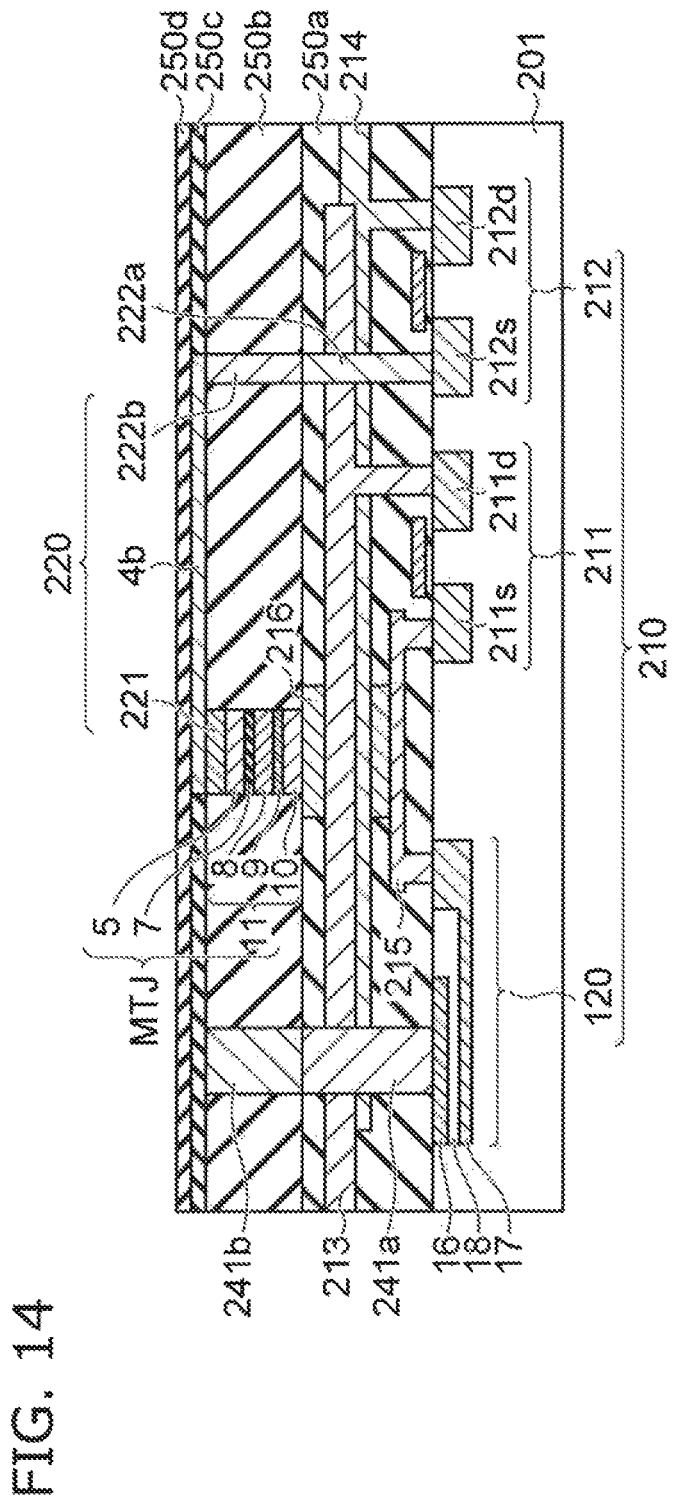

As shown in FIG. 14, a conductor film that is used to form the second electrode 4b is formed on the second insulating film 250b, the connection electrode 221, the second-level second vertical interconnect 222b, and the second-level third vertical interconnect 241b. Continuing, the second electrode 4b is formed by patterning the conductor film. The second electrode 4b is electrically connected to the connection electrode 221 and the second-level second vertical interconnect 222b. Thereby, the first electrode structure 220 is formed. Continuing, a third insulating film 250c is formed on the second insulating film 250b and the second electrode 4b. Continuing, the front surface of the third insulating film 250c is planarized. Continuing, for example, a fourth insulating film 250d is formed on the third insulating film 250c and the second electrode 4b.

4. Form the Bias Structure 230

Figure 15:
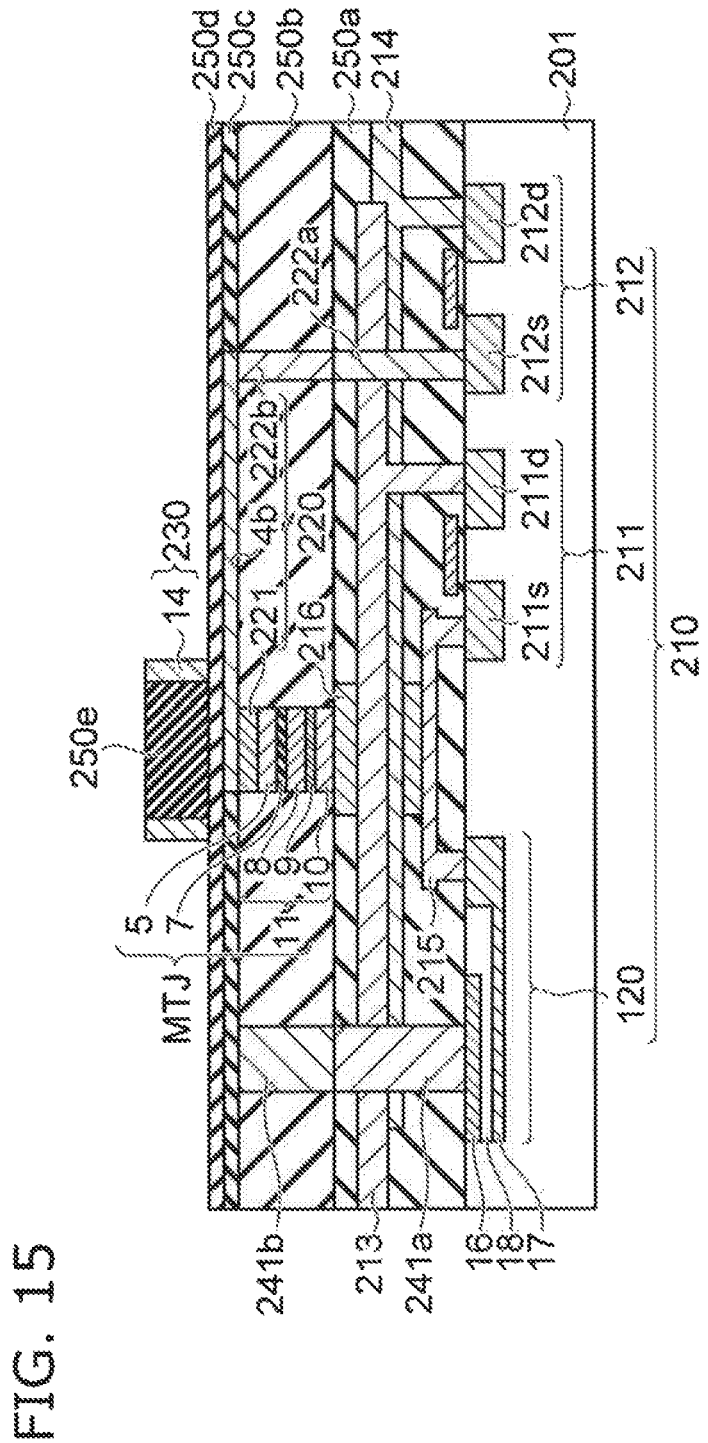

As shown in FIG. 15, an insulating film that is used to form a fifth insulating film 250e is formed on the fourth insulating film 250d. Continuing, the insulating film is patterned. Thereby, for example, the fifth insulating film 250e that has a cylindrical configuration is formed above the magnetic tunnel junction structure MTJ. Continuing, a magnetic film that is used to form the sixth magnetic layer 14 is formed on the fourth insulating film 250d and the fifth insulating film 250e. Continuing, anisotropic etching of the magnetic film is performed; and a ring configuration is caused to remain on the side wall of the fifth insulating film 250e. Thereby, the sixth magnetic layer 14 that has the ring configuration is formed on the fourth insulating film 250d; and the bias structure 230 is formed.

Figure 16:
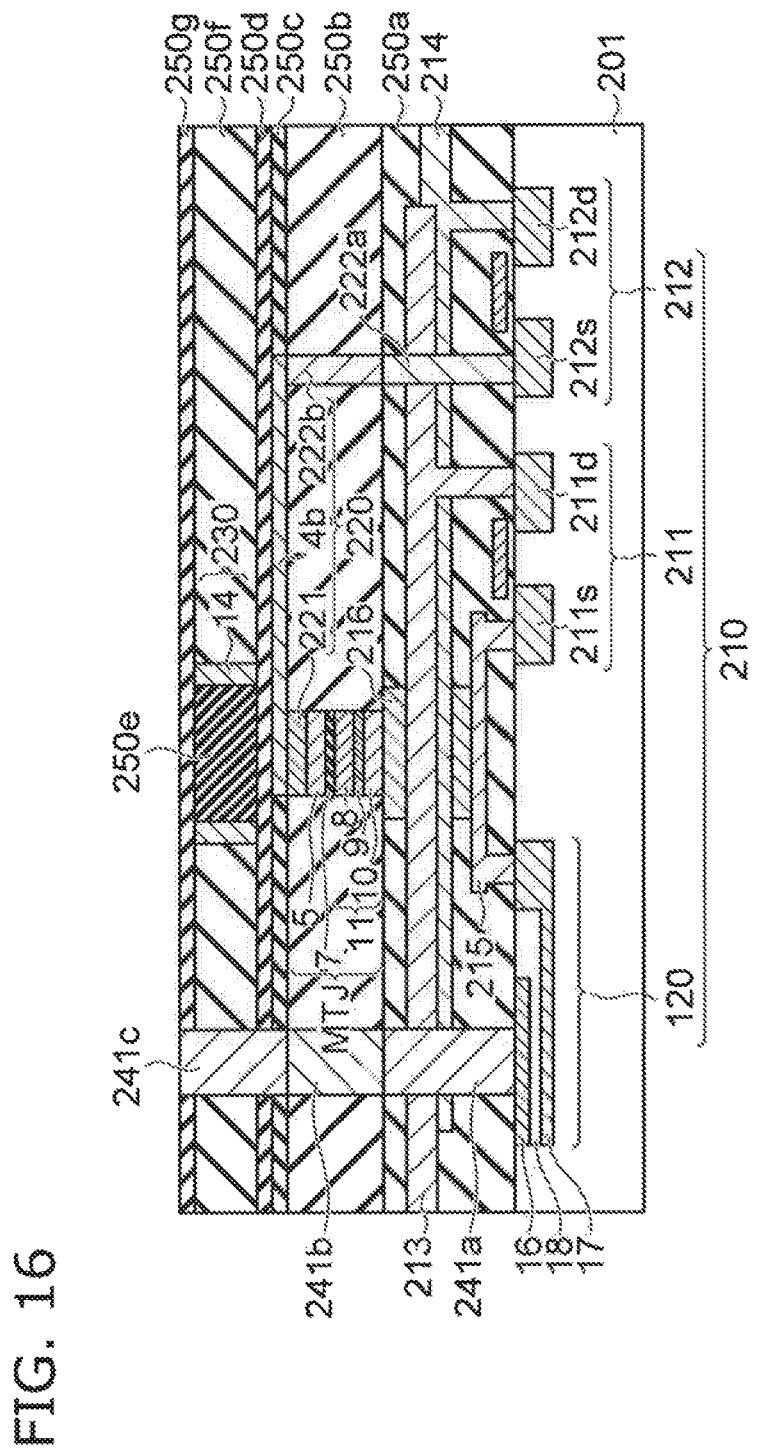

As shown in FIG. 16, a sixth insulating film 250f is formed on the fourth insulating film 250d, the sixth magnetic layer 14, and the fifth insulating film 250e. Continuing, the front surface of the sixth insulating film 250f is planarized. Continuing, for example, a seventh insulating film 250g is formed on the fifth insulating film 250e, the sixth magnetic layer 14, and the sixth insulating film 250f. Continuing, a third-level third vertical interconnect 241c is formed in the seventh insulating film 250g, the sixth insulating film 250f, the fourth insulating film 250d, and the third insulating film 250c. The third-level third vertical interconnect 241c is electrically connected to the second-level third vertical interconnect 241b.

5. Form the Second Electrode Structure 240

Figure 17:
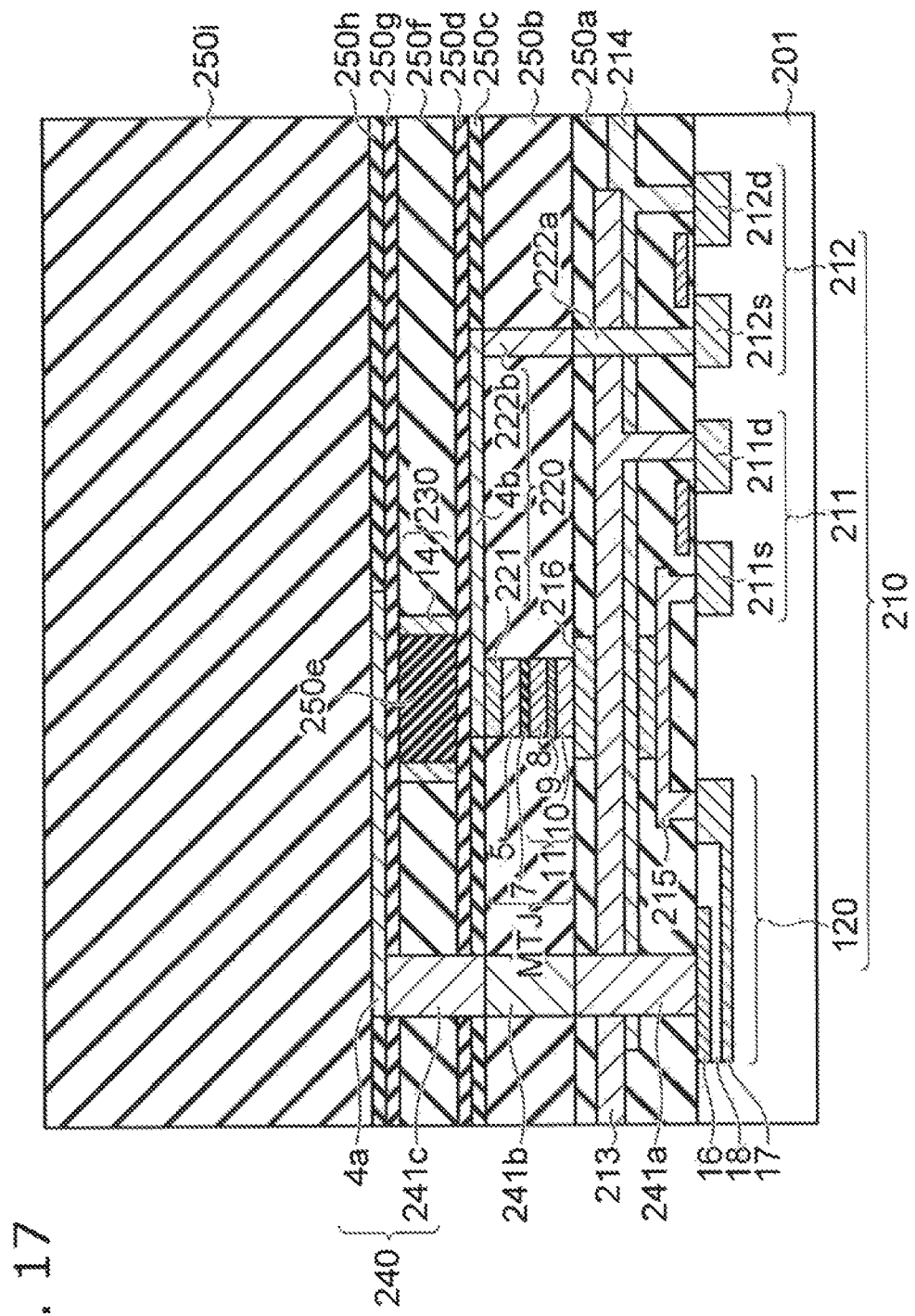

As shown in FIG. 17, a conductor film that is used to form the first electrode 4a is formed on the seventh insulating film 250g and the third-level third vertical interconnect 241c. Continuing, the first electrode 4a is formed by patterning the conductor film. The first electrode 4a extends above the fifth insulating film 250e from the third-level third vertical interconnect 241c. The first electrode 4a is electrically connected to the third-level third vertical interconnect 241c. Thereby, the second electrode structure 240 is formed. Continuing, an eighth insulating film 250h is formed on the seventh insulating film 250g and the first electrode 4a. Continuing, the front surface of the eighth insulating film 250h is planarized. Continuing, for example, a ninth insulating film 250i is formed on the eighth insulating film 250h and the first electrode 4a.

6. Form the Memory Hole 260

Figure 18:
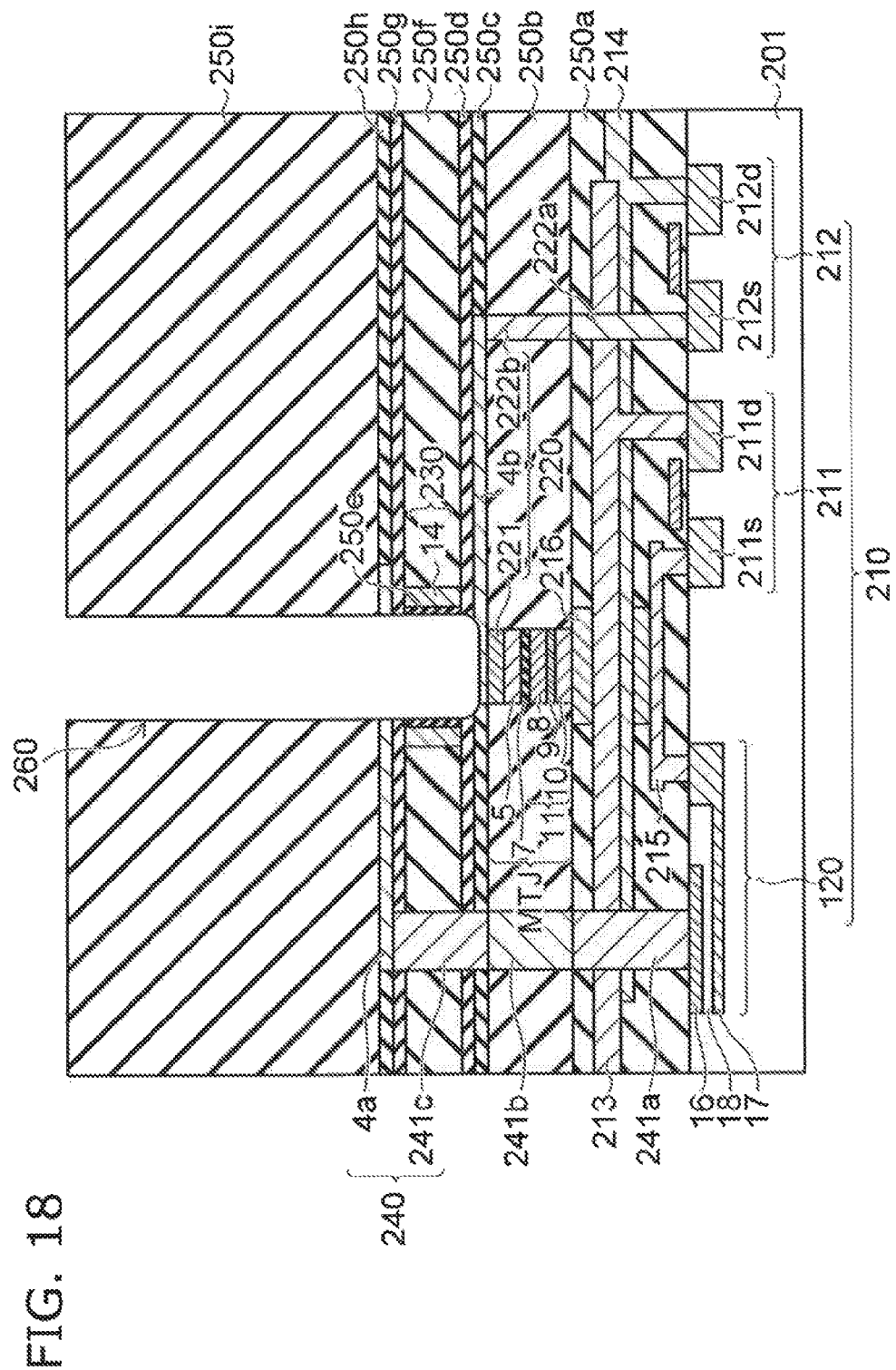

As shown in FIG. 18, the memory hole 260 that reaches the second electrode 4b is formed in the ninth insulating film 250i, the first electrode 4a, the seventh insulating film 250g, the fifth insulating film 250e, and the fourth insulating film 250d. The first electrode structure 240 is exposed at the side portion of the memory hole 260. The first electrode 4a is exposed in the embodiment. The second electrode structure 220 is exposed at the bottom portion of the memory hole 260. The second electrode 4b is exposed in the embodiment.

The connection electrode 221 protects the magnetic tunnel junction structure MTJ when the memory hole 260 is formed. Anisotropic etching, e.g., reactive ion etching (RIE) is used when forming the memory hole 260. For example, over-etching of the second electrode 4b is performed in the RIE process. The magnetic tunnel junction MTJ is formed below the second electrode 4b. However, the connection electrode 221 exists between the second electrode 4b and the magnetic tunnel junction MTJ. The connection electrode 221 protects the magnetic tunnel junction structure MTJ when excessive over-etching of the second electrode 4b occurs. Therefore, the progress of the etching to the magnetic tunnel junction structure MTJ can be suppressed. As a result of the progress of the etching being suppressed, for example, the film thickness fluctuation is suppressed for the second magnetic layer 5, etc. Accordingly, the fluctuation of the resistance value of the magnetic tunnel junction structure MTJ included in the magnetic memory 200 that occurs due to the manufacturing processes can be suppressed to be in a smaller range.

7. Form the Structure Body 1

Figure 19:
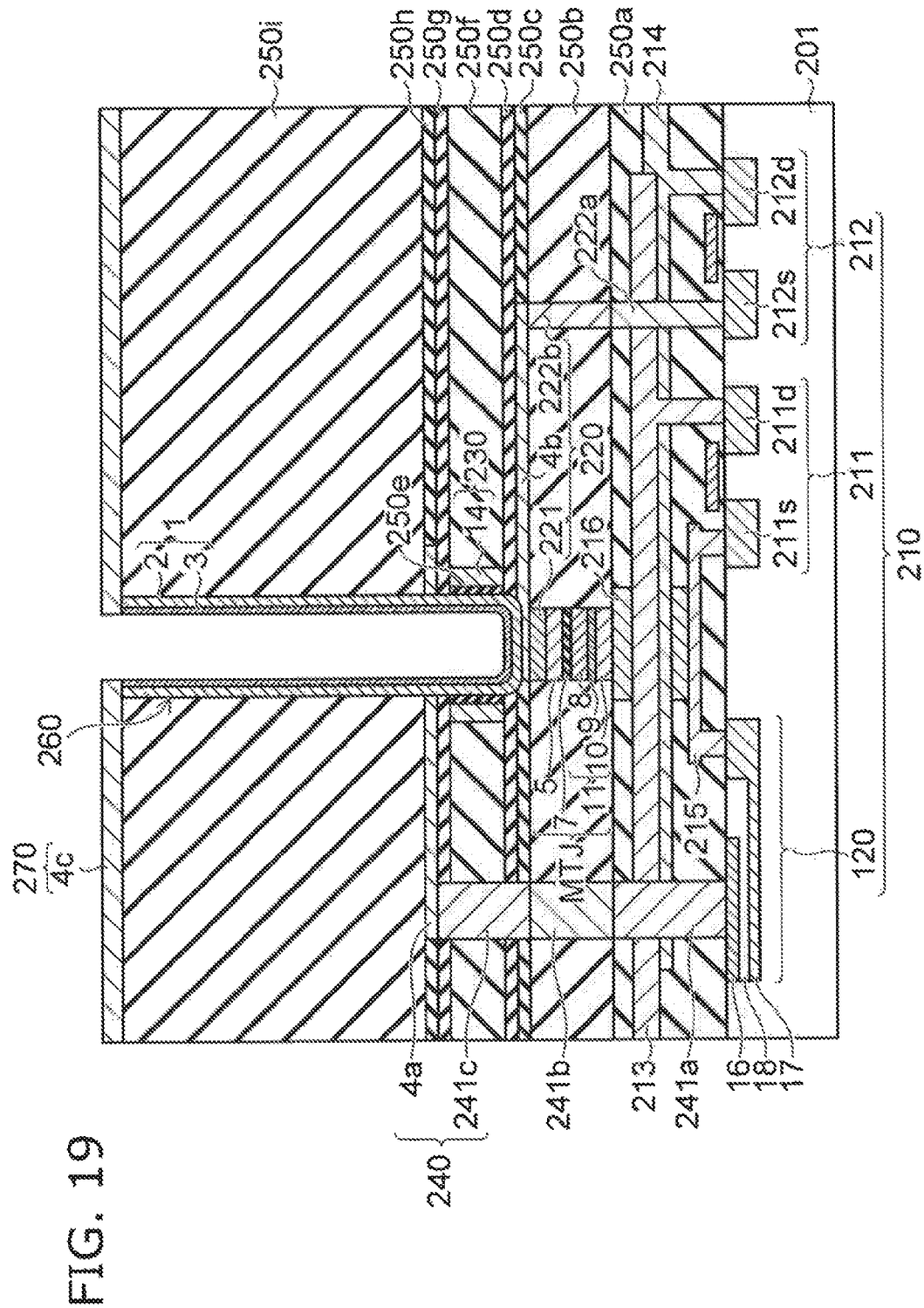

As shown in FIG. 19, the first magnetic layer 2 is formed on the inner wall including the bottom portion and side portion of the memory hole 260. The first magnetic layer 2 is electrically connected to the first electrode structure 220 at the bottom portion of the memory hole 260. In the embodiment, the first magnetic layer 2 is electrically connected to the second electrode 4b. The first magnetic layer 2 is electrically connected to the second electrode structure 240 at the side portion of the memory hole 260. In the embodiment, the first magnetic layer 2 is electrically connected to the first electrode 4a. The first magnetic layer 2 is insulated from the sixth magnetic layer 14 by the fifth insulating film 250e at the side portion of the memory hole 260. Continuing, the conductive layer 3 is formed on the first magnetic layer 2. Thereby, the structure body 1 that includes the first magnetic layer 2 and the conductive layer 3 is formed on the inner wall of the memory hole 260.

8. Form the Third Electrode Structure 270

The portion of the structure body 1 at the upper surface of the ninth insulating film 250i is removed. Continuing, the third electrode 4c is formed on the upper end of the structure body 1 and the upper surface of the ninth insulating film 250i. Thereby, the third electrode structure 270 that includes the third electrode 4c is formed on the ninth insulating film 250i and the structure body 1.

For example, the magnetic memory 200 according to the second embodiment can be manufactured by the manufacturing method described in reference to FIG. 12 to FIG. 19.

In such a method for manufacturing the magnetic memory 200, the memory hole 260 and the structure body 1 are formed after forming the magnetic tunnel junction structure MTJ. The structure body 1 includes the first magnetic layer 2 that is used as the magnetic recording layer and the conductive layer 3 that is used in the spin injection.

Thus, according to the manufacturing method according to the embodiment, the process of forming the magnetic tunnel junction structure MTJ and the process of forming the structures necessary for the spin injection and the domain wall movement are separated when manufacturing the spin injection domain wall memory. Therefore, the processes do not interfere with each other. Accordingly, the manufacturing processes of the spin injection domain wall memory are easier.

In the embodiment, as described in reference to FIG. 13, the process of forming the magnetic tunnel junction structure MTJ is not discontinued partway. Therefore, the fifth magnetic layer 11 that is used as the reference layer, the insulating layer 7, and the second magnetic layer 5 that is used as the free layer can be formed continuously without discontinuing the process. For example, compared to a magnetic tunnel junction structure MTJ in which the process is discontinued partway, the fluctuation of the electrical characteristics can be suppressed to be small for the magnetic tunnel junction structure MTJ formed without discontinuing the process. Accordingly, a magnetic tunnel junction structure MTJ that has superior electrical characteristics is obtained.

The manufacturing method according to the embodiment forms the connection electrode 221 on the magnetic tunnel junction structure MTJ. The connection electrode 221 protects the magnetic tunnel junction structure MTJ during the manufacturing processes. Therefore, even in the case where the manufacturing processes include, for example, a CMP process or an RIE process, the magnetic tunnel junction structure MT. Is not easily affected by these processes. Accordingly, for example, the manufacturing method according to the embodiment is resistant to fluctuation of the processes (process fluctuation).

According to the embodiments, a magnetic memory and a method for manufacturing the magnetic memory in which improvement of the integration is possible can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic recording and reproducing devices such as magnetic recording media, magnetic heads, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory element and nonvolatile storage devices practicable by an appropriate design modification by one skilled in the art based on the magnetic memory elements and the nonvolatile storage devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory, comprising:
   a structure body including a first magnetic layer and a conductive layer, a direction from the first magnetic layer toward the conductive layer crossing an extending direction of the structure body, the first magnetic layer including a first portion, a second portion, and a third portion, the first portion being located between the second portion and the third portion along the extending direction;
   a second magnetic layer;
   a first magnetic portion, the second magnetic layer being located between the third portion and the first magnetic portion;
   a second magnetic portion being apart from the structure body in a direction crossing the extending direction;
   an intermediate layer provided between the first magnetic portion and the second magnetic layer;
   a first electrode electrically connected with the first portion;
   a second electrode provided between the third portion and the second magnetic layer;
   a third electrode electrically connected with the second portion of the structure body;
   and
   a circuit element including
   a first semiconductor region of a first conductivity type, the first semiconductor region being electrically connected with the first electrode,
   a second semiconductor region of the first conductivity type, the second semiconductor region being electrically connected with the first magnetic portion, and
   a third semiconductor region of a second conductivity type, the third semiconductor region being electrically connected with the first semiconductor region and with the second semiconductor region.

2. The magnetic memory according to claim 1, wherein the first electrode is connected with the second electrode by a parallel circuit including a first resistance unit and a second resistance unit, the first resistance unit being due to the conductive layer, the second resistance unit being due to the first magnetic layer, the second resistance unit being connected in parallel with the first resistance unit.

3. The magnetic memory according to claim 2, wherein a resistance value of the first resistance unit is lower than a resistance value of the second resistance unit.

4. The magnetic memory according to claim 1, wherein the conductive layer is nonmagnetic.

5. The magnetic memory according to claim 1, wherein the first magnetic layer is magnetostatically coupled to the second magnetic layer.

6. The magnetic memory according to claim 1, wherein the first magnetic portion includes:
   a third magnetic layer;
   a fourth magnetic layer, the third magnetic layer being located between the fourth magnetic layer and the intermediate layer; and
   a nonmagnetic layer provided between the third magnetic layer and the fourth magnetic layer, and
   an orientation of a magnetization of the third magnetic layer is opposite to an orientation of a magnetization of the fourth magnetic layer.

7. The magnetic memory according to claim 1, further comprising:
   a first interconnect electrically connected with the first magnetic portion and the second semiconductor region;
   a second interconnect electrically connected with the second electrode; and
   a third interconnect electrically connected with the third electrode.

8. The magnetic memory according to claim 7, wherein the circuit element has a positive threshold voltage Vth and a negative threshold voltage −Vth,
   a voltage Vr between the first interconnect and the second interconnect satisfies Vr<|Vth| in a read operation,
   a voltage Vw between the first interconnect and the second interconnect satisfies Vth≤Vw or −Vw≤−Vth in a write operation, and
   a voltage Vsf between the second interconnect and the third interconnect satisfies Vw≤Vsf or −Vsf≤−Vw in a shift operation.

9. The magnetic memory according to claim 8, further comprising:
   a first external terminal;
   a second external terminal; and
   a third external terminal,
   the first external terminal being electrically connected with the first interconnect,
   the second external terminal being electrically connected with the second interconnect,
   the third external terminal being electrically connected with the third interconnect,
   a first potential difference being applied to the first external terminal and the second external terminal in the read operation,
   a second potential difference being applied to the first external terminal and the second external terminal in the write operation,
   a third potential difference being applied to the second external terminal and the third external terminal in the shift operation.

10. The magnetic memory according to claim 1, wherein first information and second information are written to the first magnetic layer.

11. The magnetic memory according to claim 10, wherein the first magnetic layer includes a first magnetic domain and a second magnetic domain,
    the first information is written to the first magnetic domain, and the second information is written to the second magnetic domain.

12. A method for manufacturing a magnetic memory, comprising:
forming a semiconductor structure in a semiconductor substrate,
the semiconductor structure including a first transistor, a second transistor, a first semiconductor region of a first conductivity type, a second semiconductor region of the first conductivity type, and a third semiconductor region of second conductivity type, the first transistor including a first source region and a first drain region, the second transistor including a second source region and a second drain region,
the second semiconductor region being electrically connected with one of the first source region and the first drain region,
the third semiconductor region being electrically connected with the first semiconductor region and the second semiconductor region;
forming a first magnetic structure on the semiconductor structure,
the first magnetic structure including a first magnetic portion, a first magnetic film, and an intermediate layer, the intermediate layer being provided between the first magnetic portion and the first magnetic film,
the first magnetic portion being electrically connected with the one of the first source region and the first drain region;
forming a first electrode structure on the first magnetic structure, the first electrode structure being electrically connected the first magnetic film and one of the second source region and the second drain region;
forming a second magnetic structure on the first electrode structure, the second magnetic structure including second magnetic portion;
forming a second electrode structure on the second magnetic structure, the second electrode structure being electrically connected with the first semiconductor region;
forming an insulating film on the second electrode structure and forming a hole in the insulating film, the hole exposing the first electrode structure at a bottom portion of the hole, the hole exposing the second electrode structure at a side portion of the hole;
forming a structure body inside the hole, the structure body including a second magnetic film and a conductive layer; and
forming a third electrode structure electrically connected with the structure body.

13. A magnetic memory, comprising:
a first transistor including a first source region and a first drain region;
a second transistor including a second source region and a second drain region;
a first semiconductor region of a first conductivity type;
a second semiconductor region electrically connected with one of the first source region and the first drain region, the second semiconductor region being of the first conductivity type;
a third semiconductor region electrically connected with the first semiconductor region and the second semiconductor region, the third semiconductor region being of a second conductivity type;
a first magnetic structure including a first magnetic portion, a first magnetic film, and an intermediate layer, the intermediate layer being provided between the first magnetic region and the first magnetic film, the first magnetic portion being electrically connected with the one of the first source region and the first drain region;
a first electrode structure provided on the first magnetic structure, the first electrode structure being electrically connected with the first magnetic film and one of the second source region and the second drain region;
a second magnetic structure including a second magnetic portion provided on the first electrode structure;
a second electrode structure provided on the second magnetic structure and electrically connected with the first semiconductor region;
an insulating film provided on the second electrode structure, the insulating film having a hole provided in the insulating film;
a structure body provided in the hole, the structure body including a second magnetic film and a conductive layer; and
a third electrode structure electrically connected with the structure body.

14. The magnetic memory according to claim 13, wherein the second magnetic film is magnetostatically coupled to the first magnetic film.

15. The magnetic memory according to claim 13, wherein the first magnetic portion includes:
a third magnetic layer;
a fourth magnetic layer; and
a nonmagnetic layer provided between the third magnetic layer and the fourth magnetic layer, and
an orientation of a magnetization of the third magnetic layer is opposite to an orientation of a magnetization of the fourth magnetic layer.

* * * * *